United States Patent
Whetsel

(10) Patent No.: US 10,649,032 B2
(45) Date of Patent: May 12, 2020

(54) CORE CIRCUITRY, TAP DOMAIN CIRCUITRY, SEPARATE AUXILIARY CIRCUITRY, OUTPUT BUFFERS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/148,030

(22) Filed: Oct. 1, 2018

(65) Prior Publication Data

US 2019/0041460 A1 Feb. 7, 2019

Related U.S. Application Data

(62) Division of application No. 15/657,917, filed on Jul. 24, 2017, now Pat. No. 10,126,364, which is a division of application No. 15/346,110, filed on Nov. 8, 2016, now Pat. No. 9,759,771, which is a division of application No. 14/837,786, filed on Aug. 27,
(Continued)

(51) Int. Cl.
*G01R 31/3185* (2006.01)
*G01R 31/3177* (2006.01)
*G01R 31/28* (2006.01)

(52) U.S. Cl.
CPC . *G01R 31/318558* (2013.01); *G01R 31/2851* (2013.01); *G01R 31/3177* (2013.01); *G01R 31/318594* (2013.01); *G01R 31/318536* (2013.01); *G01R 31/318572* (2013.01)

(58) Field of Classification Search
CPC ........ G01R 31/318594; G01R 31/3177; G01R 31/2851; G01R 31/28; G01R 31/318536; G01R 31/318558; G01R 31/317; G01R 31/318572; G01R 31/318555; G01R 31/31713; G01R 31/31724; G01R 31/31727; G06F 13/4282; G06F 13/287; G06F 1/12
See application file for complete search history.

(56) References Cited

U.S. PATENT DOCUMENTS

| | | |
|---|---|---|
| 5,631,912 A | 5/1997 | Mote, Jr. |
| 5,862,152 A | 1/1999 | Handly |

(Continued)

OTHER PUBLICATIONS

Lee Whetsel, "An IEEE Based Test Access Architecture for ICs With Embedded Cores", International Test Conference 1997 Proceedings, Nov. 1-6, 1997.
(Continued)

*Primary Examiner* — Cynthia Britt
(74) *Attorney, Agent, or Firm* — Lawrence J. Bassuk; Charles A. Brill; Frank D. Cimino

(57) ABSTRACT

The present disclosure describes novel methods and apparatuses for directly accessing JTAG Tap domains that exist in a scan path of many serially connected JTAG Tap domains. Direct scan access to a selected Tap domain by a JTAG controller is achieved using auxiliary digital or analog terminals associated with the Tap domain and connected to the JTAG controller. During direct scan access, the auxiliary digital or analog terminals serve as serial data input and serial data output paths between the selected Tap domain and the JTAG controller.

4 Claims, 28 Drawing Sheets

Related U.S. Application Data 2015, now Pat. No. 9,519,025, which is a division of application No. 14/189,444, filed on Feb. 25, 2014, now Pat. No. 9,146,272, which is a division of application No. 13/782,585, filed on Mar. 1, 2013, now Pat. No. 8,713,390, which is a division of application No. 13/439,454, filed on Apr. 4, 2012, now Pat. No. 8,412,995, which is a division of application No. 13/039,517, filed on Mar. 3, 2011, now Pat. No. 8,176,374, which is a division of application No. 12/712,600, filed on Feb. 25, 2010, now Pat. No. 7,925,943, which is a division of application No. 12/055,676, filed on Mar. 26, 2008, now Pat. No. 7,698,612, which is a division of application No. 11/150,891, filed on Jun. 13, 2005, now Pat. No. 7,395,471.

(60) Provisional application No. 60/580,673, filed on Jun. 17, 2004.

(56) References Cited

U.S. PATENT DOCUMENTS

| | | | |
|---|---|---|---|
| 5,884,023 A | | 3/1999 | Swoboda et al. |
| 6,055,649 A | | 4/2000 | Deao |
| 6,112,298 A | | 8/2000 | Deao |
| 6,115,763 A | | 9/2000 | Douskey et al. |
| 6,125,464 A | * | 9/2000 | Jin .................. G01R 31/318572 714/724 |
| 6,385,749 B1 | | 5/2002 | Adusumilli et al. |
| 6,425,100 B1 | | 7/2002 | Bhattacharya |
| 6,760,876 B1 | | 7/2004 | Grannis, III |
| 6,829,730 B2 | | 12/2004 | Nadeau-Dostie et al. |
| 6,988,232 B2 | * | 1/2006 | Ricchetti ........ G01R 31/318563 714/736 |
| 7,395,471 B2 | | 7/2008 | Whetsel |
| 7,409,611 B2 | | 8/2008 | Whetsel |
| 7,698,612 B2 | * | 4/2010 | Whetsel ......... G01R 31/318594 714/727 |
| 7,925,943 B2 | | 4/2011 | Whetsel |
| 8,176,374 B2 | | 5/2012 | Whetsel |
| 8,412,995 B2 | | 4/2013 | Whetsel |
| 8,713,390 B2 | | 4/2014 | Whetsel |
| 9,146,272 B2 | | 9/2015 | Whetsel |
| 2007/0101242 A1 | | 5/2007 | Yancey et al. |

OTHER PUBLICATIONS

"From design-for-test to design-for-debug-and-test: analysis of requirements and limitations for 1149.1" by Alves et al. This paper appears in: VLSI Test Symposium, 1999. Proceedings. 17th IEEE Publication Date: 1999 on pp. 473-480 ISBN: 0-7695-0146-X INSPEC Accession No. 6451000.

"Hierarchical test access architecture for embedded cores in an integrated circuit" by Bhattacharya. This paper appears in: VLSI Test Symposium, 1998. Proceedings. 16th IEEE Publication Date: Apr. 26-30, 1998 on pp. 8-14 ISBN: 0-8186-8436-4 INSPEC Accession No. 6039765.

"IEEE standard test access port and boundary-scan architecture" This paper appears in: IEEE Std. 1149.1-2001. Publication Date: 2001 on pp. 1-200 ISBN: 0-7381-2944-5.

D. Kagaris and S. Tragoudas, "Embedded cores using built-in mechanisms," Circuits and Systems, 1999. ISCAS '99. Proceedings of the 1999 IEEE International Symposium on, Orlando, FL, 1999, pp. 23-26 vol. 1.

K. De, "Test methodology for embedded cores which protects intellectual property," Proceedings. 15th IEEE VLSI Test Symposium (Cat. No. 97TB1 00125), Monterey, CA, 1997, pp. 2-9.

E.J. Marinissen and M. Lousberg, "The role of test protocols in testing embedded-core-based system ICs," European Test Workshop 1999 (Cat. No. PR00390), Constance, Germany, 1999, pp. 70-75.

\* cited by examiner

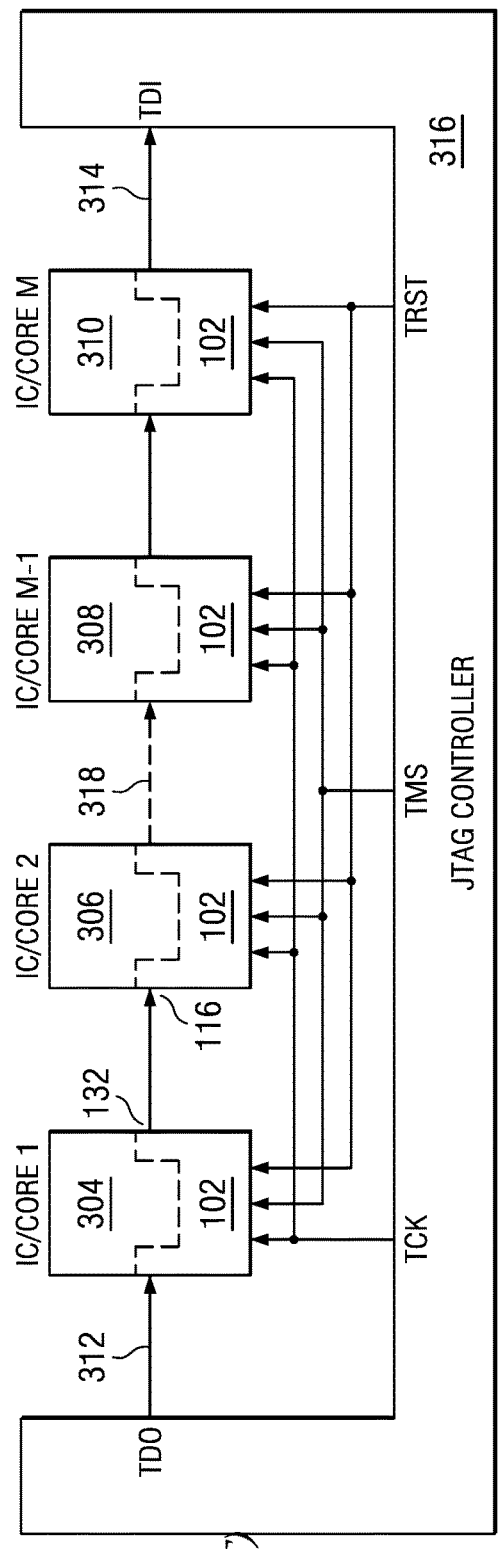
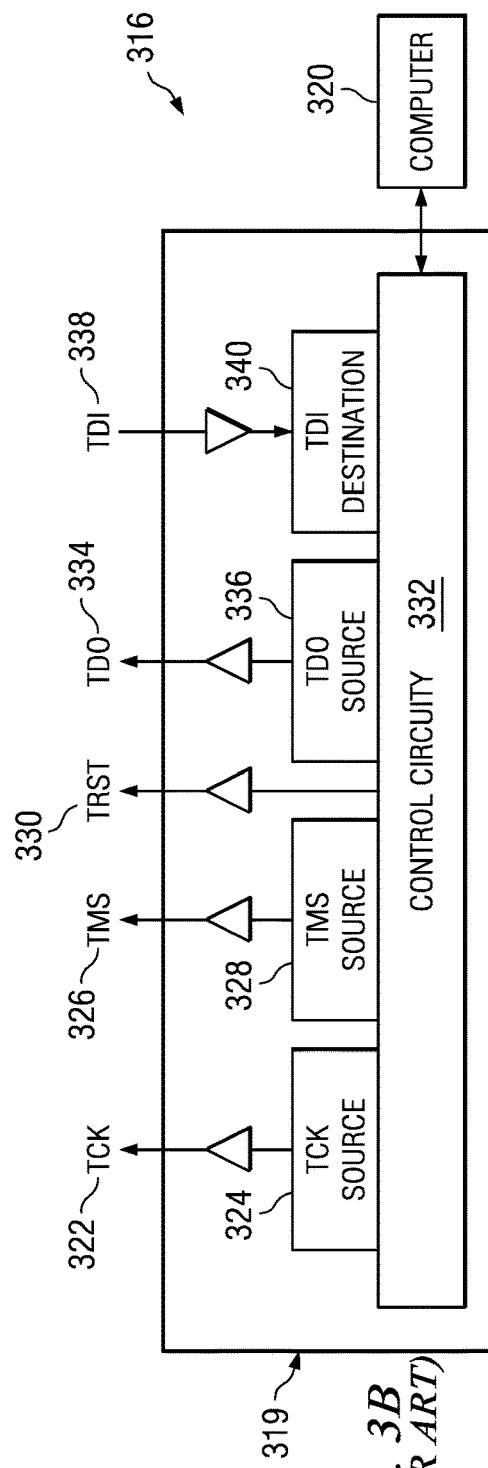
FIG. 3A (PRIOR ART)
FIG. 3B (PRIOR ART)

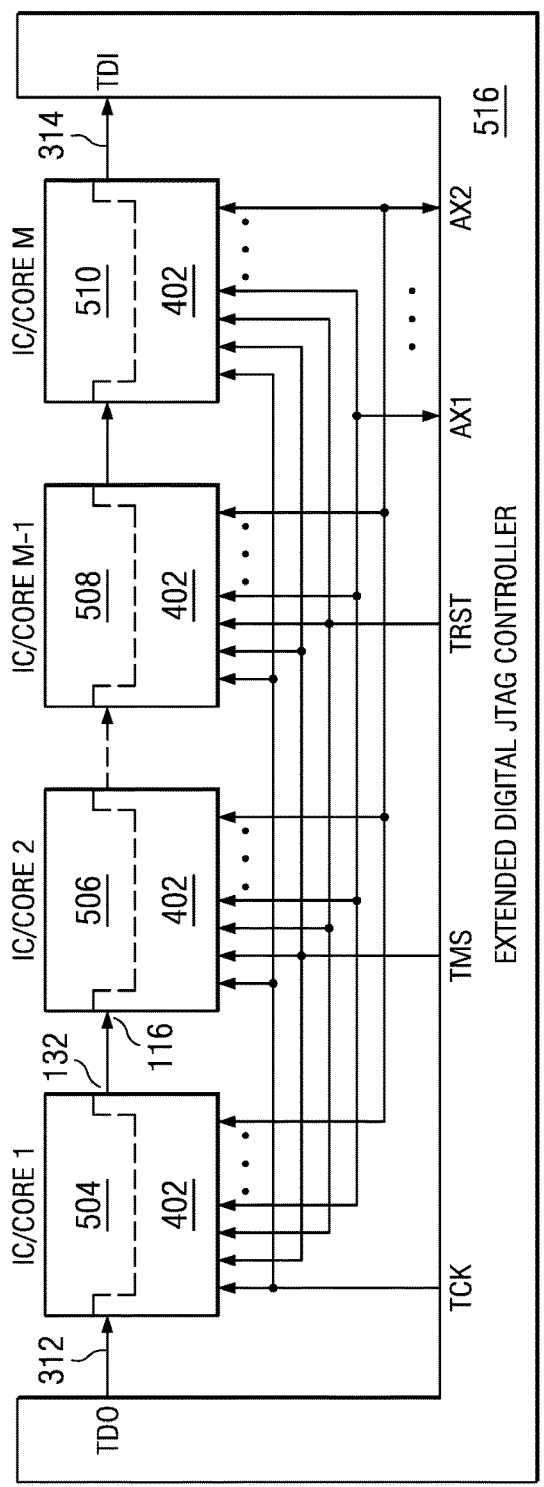
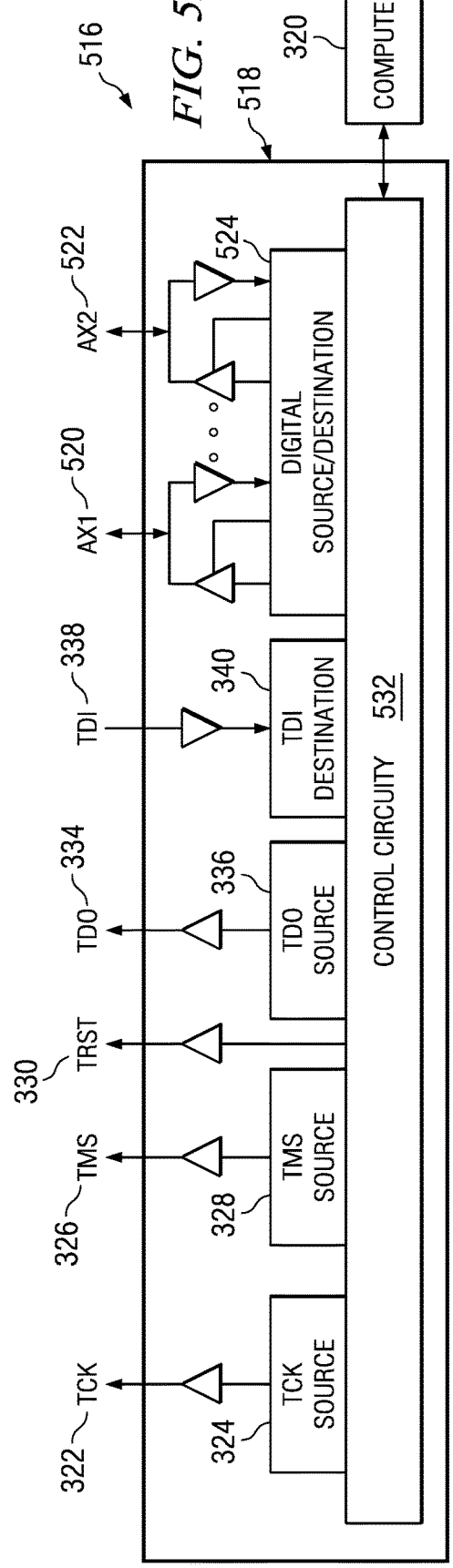

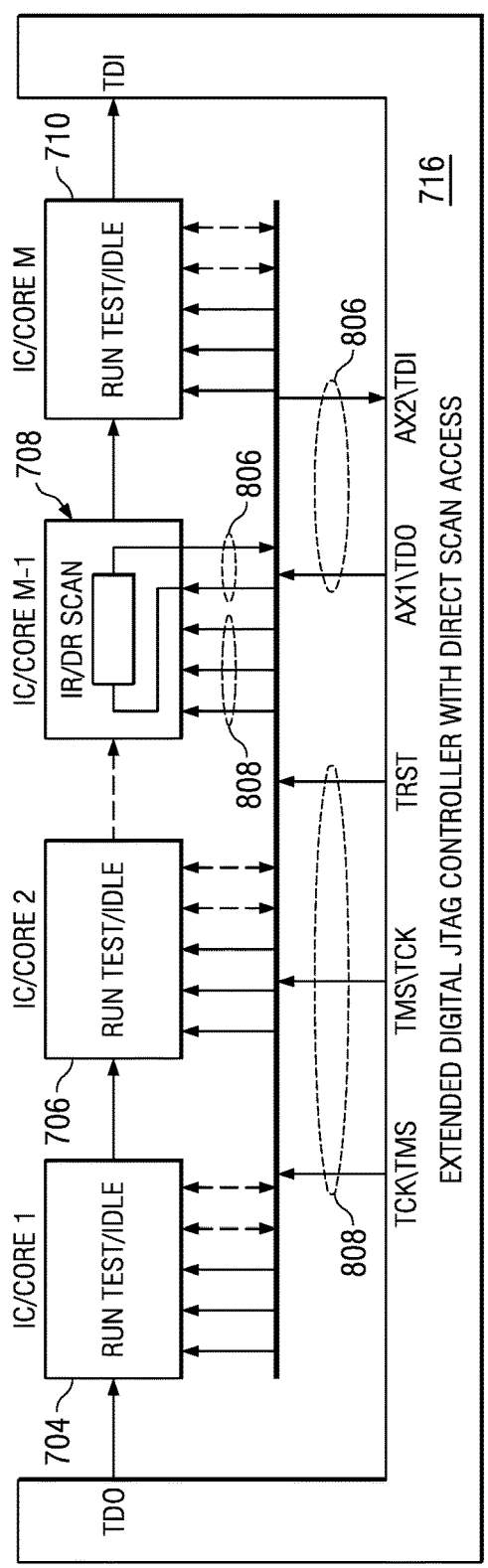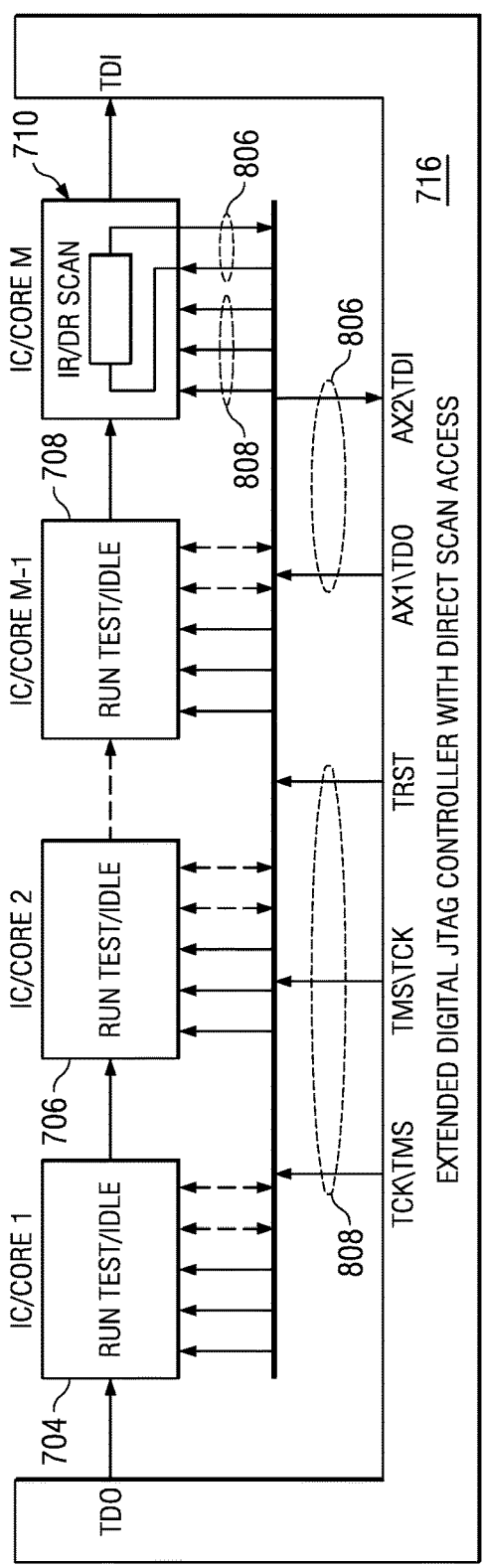

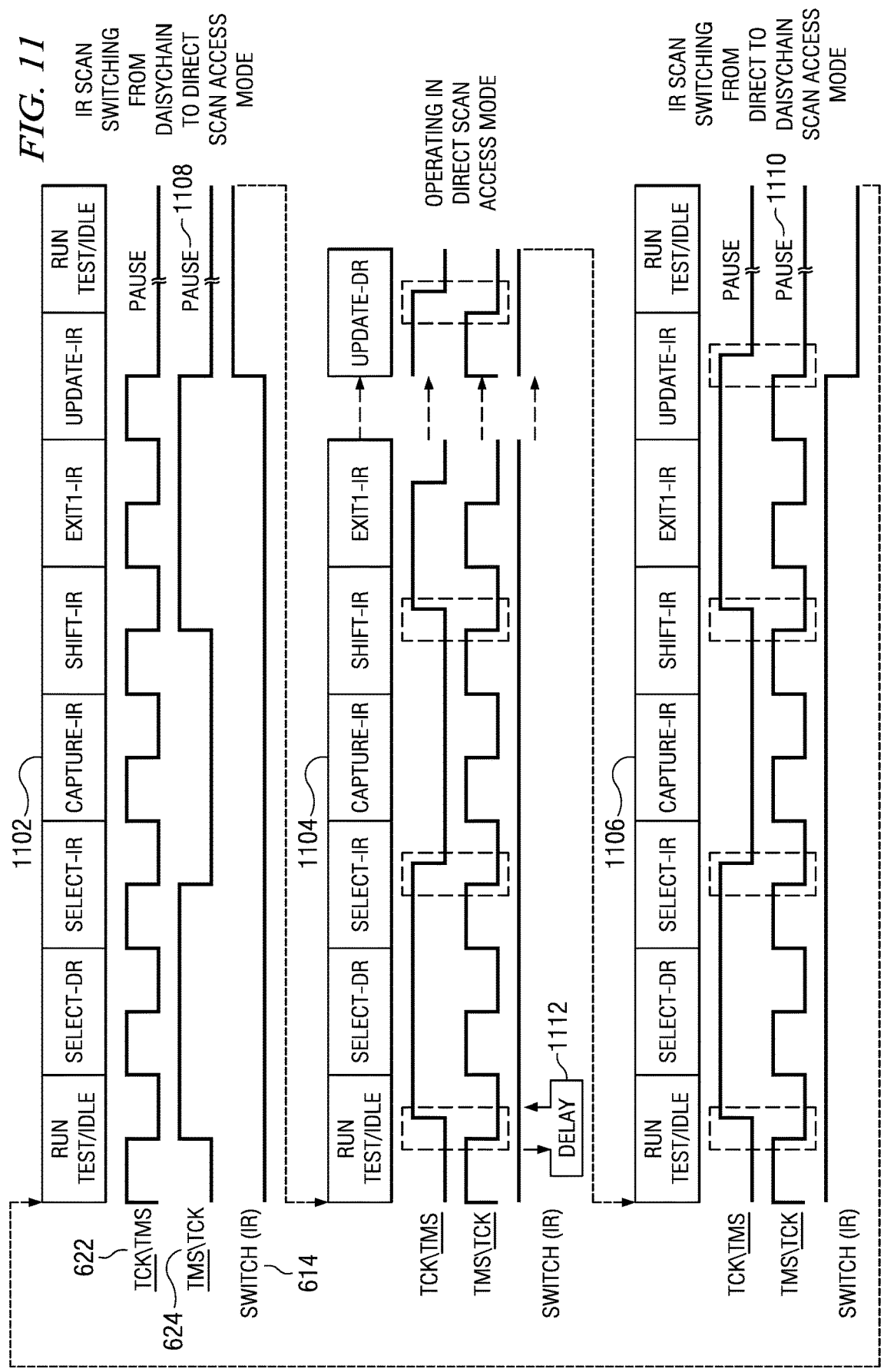

EXTENDED DIGITAL/ANALOG JTAG CONTROLLER WITH SIMULTANEOUS DAISYCHAIN AND DIRECT SCAN ACCESS

US 10,649,032 B2

CORE CIRCUITRY, TAP DOMAIN CIRCUITRY, SEPARATE AUXILIARY CIRCUITRY, OUTPUT BUFFERS

CROSS REFERENCE TO RELATED PATENTS

This application is a divisional of application Ser. No. 15/657,917, filed Jul. 24, 2017, now U.S. Pat. No. 10,126,364, issued Nov. 13, 2018;

Which was a divisional of prior application Ser. No. 15/346,110, filed Nov. 8, 2016, now U.S. Pat. No. 9,759,771, granted Sep. 12, 2017;

Which was a divisional of prior application Ser. No. 14/837,786, filed Aug. 27, 2015, now U.S. Pat. No. 9,519,025, granted Dec. 13, 2016;

Which was a divisional of prior application Ser. No. 14/189,444, filed Feb. 25, 2014, now U.S. Pat. No. 9,146,272, granted Sep. 29, 2015;

Which was a divisional of prior application Ser. No. 13/782,585, filed Mar. 1, 2013, now U.S. Pat. No. 8,713,390, granted Apr. 29, 2014;

Which was a divisional of prior application Ser. No. 13/439,454, filed Apr. 4, 2012, now U.S. Pat. No. 8,412,995, granted Apr. 2, 2013;

Which was a divisional of prior application Ser. No. 13/039,517, filed Mar. 3, 2011, now U.S. Pat. No. 8,176,374, granted May 8, 2012;

Which was a divisional of prior application Ser. No. 12/712,600, filed Feb. 25, 2010, now U.S. Pat. No. 7,925,943, granted Apr. 12, 2011;

Which was a divisional of prior application Ser. No. 12/055,676, filed Mar. 26, 2008, now U.S. Pat. No. 7,698,612, granted Apr. 13, 2010;

which was a divisional of prior application Ser. No. 11/150,891, filed Jun. 13, 2005, now U.S. Pat. No. 7,395,471, granted Jul. 1, 2008;

Which claims priority from provisional Application No. 60/580,673, filed Jun. 17, 2004.

This application is related to U.S. application Ser. No. 11/015,816, filed Dec. 17, 2004, "JTAG Bus Communication Method and Apparatus", U.S. application Ser. No. 10/983,256, filed Nov. 4, 2204, "Removable and Replaceable Tap Domain Selection Circuitry", now U.S. Pat. No. 7,200,783, issued Apr. 3, 2007, and U.S. Pat. No. 6,393,081 "Plural Circuit Selection Using Role Reversing Control Inputs", all of which are incorporated herein by reference.

FIELD OF THE DISCLOSURE

This disclosure relates in general to circuit design and in particular to improvements in the design of IEEE 1149.1 Tap interfaces of devices (such as ICs, cores, and/or other circuits) for enhancing communication to and from the devices during operations such as, but not limited too, (1) test operations, (2) debug operations, (3) trace operations, (4) emulation operations, (5) in-system-programming operations, and (6) other, as needed, operations.

BACKGROUND OF THE DISCLOSURE

Today the IEEE 1149.1 (JTAG) Test Access Port (Tap) interface is used for many different applications. While initially designed to provide a serial test interface on ICs to facilitate board testing, the Tap interface now serves as a serial interface for additional IEEE standards for such things as emulation, trace, and debug (IEEE 5001) of ICs and cores, mixed signal testing (IEEE 1149.4) of ICs and cores, advanced IC to IC interconnect testing (IEEE 1149.6), embedded core testing (IEEE 1500), and in-system-programming of circuits in ICs and cores (IEEE 1532).

An IC device may contain many embedded 1149.1 based Tap architectures (Tap domains). Some of these TAP domains are associated with intellectual property (IP) core circuit devices within the IC, and serve as access interfaces to test, debug, trace, emulation, and in-system-programming circuitry within the IP cores. Other TAP domains may exist in the IC which are not associated with cores but rather to circuitry in the IC external of the cores. Further, the IC itself will typically contain a TAP domain for operating IC level test, debug, trace, emulation, and in-system-programming, as well as the boundary scan register associated with the IC's input and output terminals.

From the above, it is clear that Tap domains are being used in ever growing numbers in devices, such as ICs and cores, for test, debug, trace, emulation, in-system-programming, and other types of operations.

BRIEF SUMMARY OF THE DISCLOSURE

The present disclosure describes and provides for novel methods and apparatuses for directly accessing a desired Tap Domain in a scan path of many serially connected Tap Domains. The ability to directly access a selected Tap Domain in a scan path of many Tap Domains allows more efficient serial access to the selected Tap Domain for test, debug, emulation, programming, and/or other operations.

In one embodiment a Tap domain can selectively operate in daisy-chained or direct scan access modes by reversing the TCK and TMS input terminal connections to the Tap domain's Tap controller, and reusing auxiliary digital terminals for direct scan access TDI and TDO terminals. This Tap domain requires a JTAG controller that can reverse its TCK and TMS output terminals and reuse auxiliary digital terminals for direct scan access TDI and TDO terminals.

In another embodiment a Tap domain can selectively operate in daisy-chained or direct scan access modes by reversing the TCK and TMS input terminal connections to the Tap domain's Tap controller 104, and reusing auxiliary analog terminals for direct scan access TDI and TDO terminals. This Tap domain 1502 requires a JTAG controller that can reverse its TCK and TMS output terminals and reuse auxiliary analog terminals for direct scan access TDI and TDO terminals.

In another embodiment a Tap domain can selectively operate in a daisy-chained mode using a first Tap controller and in a direct scan access mode using a second Tap controller. Like the earlier Tap domain embodiments, this Tap domain reuses auxiliary digital or analog terminals for direct scan access TDI and TDO terminals. This Tap domain requires a JTAG controller that can reverse its TCK and TMS output terminals and reuse auxiliary digital or analog terminals for direct scan access TDI and TDO terminals.

In another embodiment a Tap domain can selectively operate in daisy-chained or direct scan access modes by using two separate TMS input terminals, and reusing auxiliary digital or analog terminals for direct scan access TDI and TDO terminals. This Tap domain requires a JTAG controller that has two separately controllable TMS output terminals and can reuse auxiliary digital or analog terminals for direct scan access TDI and TDO terminals.

In another embodiment a Tap domain can selectively operate in a daisy-chained or in a simultaneous daisy-chain and direct scan access modes. During the simultaneous daisy-chain and direct scan access mode, the daisy-chain access is achieved using the normal TDI and TDO terminals, while the direct scan access is achieved by reusing auxiliary digital or analog terminals as additional TDI and TDO terminals. This Tap domain requires a JTAG controller that has a first TDO source for transmitting data to a first TDO terminal, a second TDO source for transmitting data to an auxiliary digital or analog terminal used as a second TDO terminal, a first TDI destination for receiving data from a first TDI terminal, and a second TDI destination for receiving data from an auxiliary digital or analog terminal used as a second TDI terminal.

While the scan path examples of these embodiments show all the IC/cores in the scan paths as being adapted to include one of the Tap domain embodiments of the present disclosure, that need not be the case. Indeed the scan paths may include mixtures of IC/cores with adapted and non-adapted Tap domains. The operation of the present embodiments to provide direct scan access to a selected and adapted Tap domain in a scan path of Tap domains is independent of whether the scan path includes non-adapted Tap domains or not.

BRIEF DESCRIPTION OF THE VIEWS OF THE DRAWINGS

FIG. 3A depicts a JTAG controller coupled to a scan path of ICs/cores each including a convention Tap domain.

FIG. 3B depicts the JTAG controller of FIG. 3A in more detail.

FIG. 5A depicts a JTAG controller coupled to a scan path of ICs/cores each including the Tap domain of FIG. 4.

FIG. 5B depicts the JTAG controller of FIG. 5A in more detail.

FIGS. 9A-9D illustrate the FIG. 6 Tap domains being controlled by the JTAG controller of FIG. 7B to operate in direct scan access modes according to the present disclosure.

FIG. 11 depicts timing of JTAG instruction register scan operations being used to switch Tap domains between daisy-chain and direct scan access modes according to the present disclosure.

DETAILED DESCRIPTION

Figure 1:
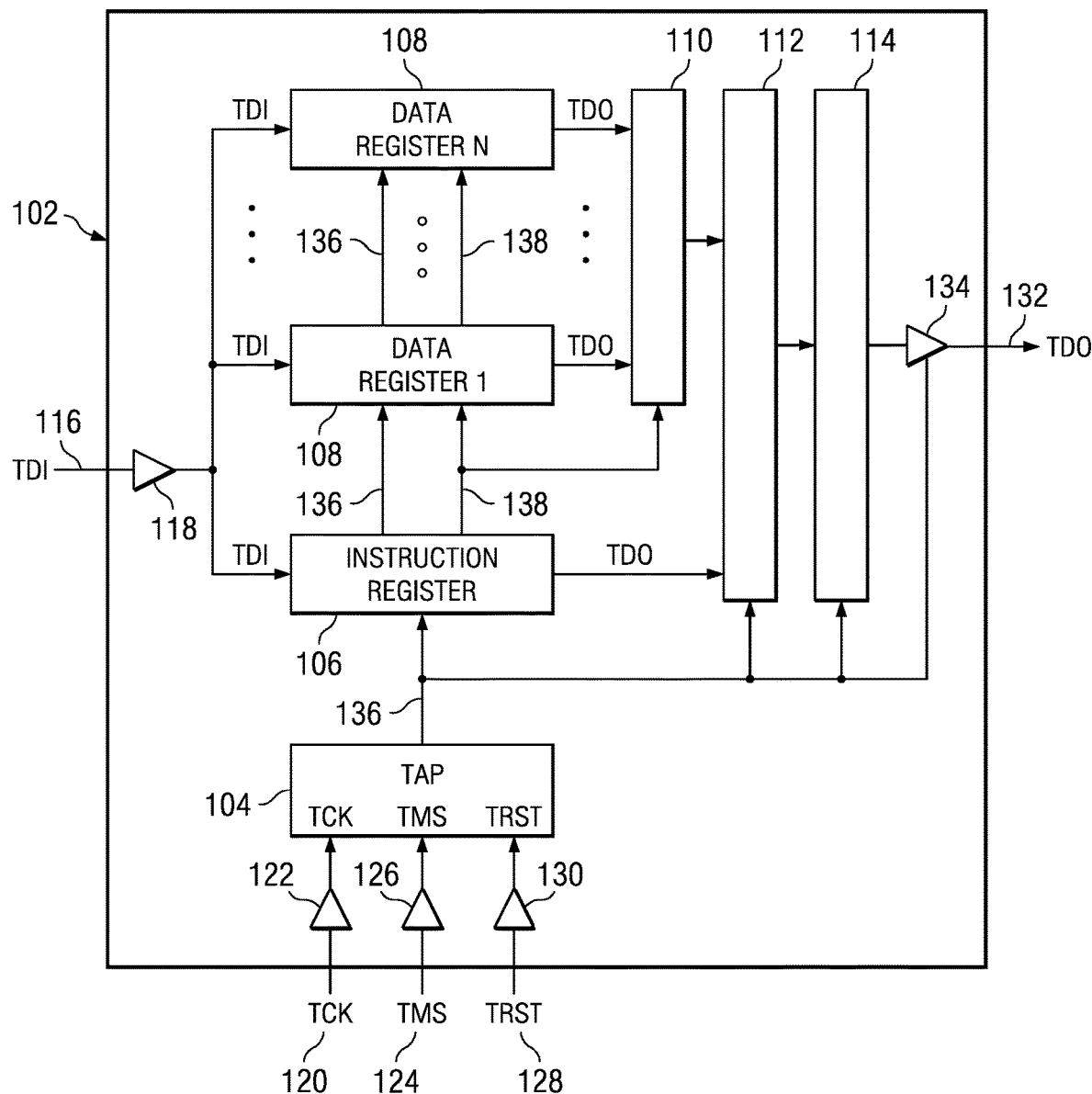
FIG. 1 depicts a conventional JTAG Tap domain including a Tap controller, instruction register, and data registers.

FIG. 1 depicts an example of an IEEE 1149.1 Tap domain 102. The Tap domain includes a Tap controller 104, an instruction register (IR) 106, at least two data registers (DR) 108, multiplexers 110 and 112, test data output (TDO) register 114. The Tap domain interface consists of a test data input (TDI) input 116 and buffer 118, a test clock (TCK) input 120 and buffer 122, a test mode select (TMS) input 124 and buffer 126, a test reset (TRST) input 128 and buffer 130, and a TDO output 132 and buffer 134. The Tap controller 104 outputs a control bus 136 to the data and instruction registers 106 and 108, multiplexer 112, output register 114, and buffer 134. The instruction register 106 outputs a control bus 138 to the data registers 108 and multiplexer 110. In response control inputs on TCK and TMS the Tap controller 104 outputs control on bus 136 to capture data into and shift data through either the IR 106 or a selected DR 108 from TDI to TDO. The data shifted into IR 106 or DR 108 is updated and output at the end of the shift operation. In response to a TRST input to the Tap controller 104, the TAP controller, IR 106, and optionally DRs 108 are reset to known states. The structure and operation of IEEE 1149.1 Tap domain architectures are well known.

Figure 2:
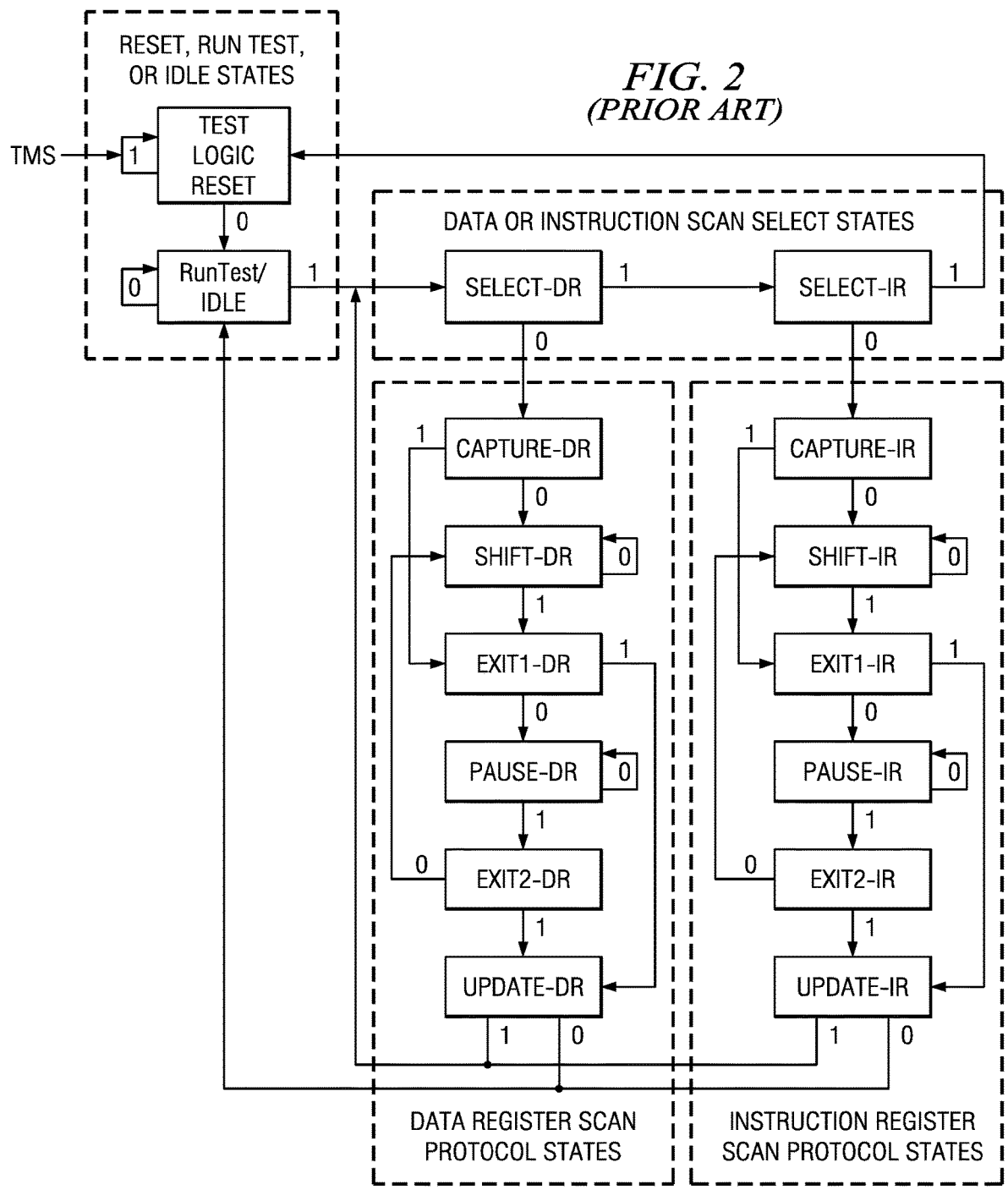
FIG. 2 depicts the state diagram of the JTAG Tap controller.

FIG. 2 depicts the state diagram of the Tap controller 104. All IEEE 1149.1 standard Tap controllers operate according to this state diagram. State transitions occur on the rising edge of TCK in response to the logic level applied to the TMS input. The IEEE 1149.1 Tap state diagram is well known.

FIG. 3A depicts an example scan path 302 where a number of Tap domain 102 interfaces of ICs 304-310 on a substrate or embedded cores 304-310 within an IC are connected together serially, via their TDI 116 and TDO 132 terminals. The TDO input 312 and TDO output 314 of the scan path 302, along with the TCK 120, TMS 124, and TRST 128 inputs of each Tap Domain, are connected to a JTAG Controller 316. The JTAG Controller can serve as a test, debug, trace, emulation, in-system-programming, and/or other application controller. While only four Tap domains 102 of ICs/cores 304-310 are shown, any number of IC/core Tap domains may exist in scan path 302, as indicated by dotted line 318.

FIG. 3B depicts an example JTAG Controller 316. The JTAG Controller consists of a Tap interface circuit 319 and a computer 320 for controlling the Tap interface circuit. The Tap interface circuit includes a TCK output 322 from a TCK source circuit 324, a TMS output 326 from a TMS source circuit 328, a TRST output 330 from control circuit 332, a TDO output 334 from a TDO source circuit 336, and a TDI input 338 to a TDI destination circuit 340. During JTAG instruction or data scan operations, the computer 320 enables the TCK, TMS, and TDO sources, via control circuitry 332, to output TCK 322 and TMS 326 control to the TCK 120 and TMS 124 inputs of the Tap domains of scan path 302 and TDO 334 data to the TDI 312 input of the scan path 302. The TDI destination 340 is also enabled, via the control circuitry 332, to receive TDI 338 data from the TDO output 314 of the scan path 302. The Tap domains in scan path 302 can be reset by the computer enabling the control circuitry 332 to output a logic low on TRST 330 to the TRST inputs 128 of the Tap domains.

As seen in FIG. 3A, if an instruction or data pattern is to be input to and/or output from a target Tap domain 102 in scan path 302 from JTAG Controller 316 the pattern must serially pass through all leading and/or following Tap domains 102 in the scan path 302. Thus a data input and/or output latency exists between a target Tap Domain in scan path 302 and JTAG Controller 316, due to having to serially traverse intermediate Tap Domains. To further exacerbate the problem, the shifting frequency of the scan path 302 is limited by the slowest shifting TAP domain in the scan path. For example, if a target Tap Domain (i.e. the one where data is to be input to and/or output from) can shift at 50 MHz, but one or more of the other Tap Domains that need to be serially traversed during the input or output operation can only shift at 10 MHz, the data transfer between the controller 316 and the target Tap Domain will be limited to the frequency of the slower Tap Domain, i.e. 10 MHz. Due to the above mentioned data latency and shift frequency limitation problems, it is clear that the data communication bandwidth between a target Tap Domain 102 and JTAG Controller 316 is not optimized.

Figure 4:
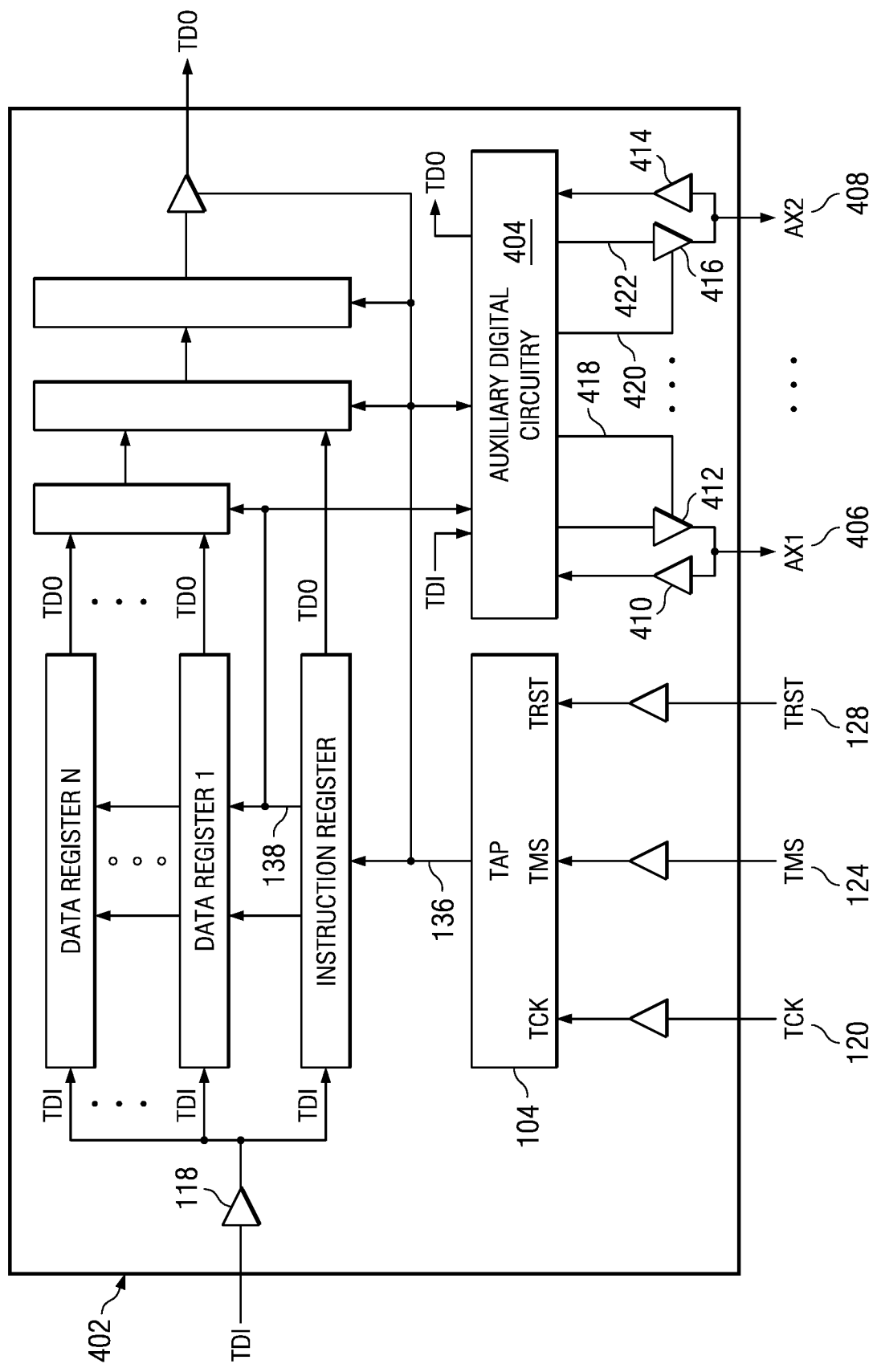
FIG. 4 depicts an extended Tap domain that includes auxiliary digital circuitry and I/O terminals.

FIG. 4 depicts an example of an IEEE 1149.1 Tap domain 402 which has been extended to include Auxiliary Digital Circuitry 404 and auxiliary terminals AX1 406 and AX2 408. The AX1 terminal is coupled to the Auxiliary Digital Circuitry via input buffer 410 and output buffer 412. The AX2 terminal is coupled to the Auxiliary Digital Circuitry via input buffer 414 and output buffer 420. I/O control signals 418 and 420 from the Auxiliary Digital Circuitry regulate the input or output modes of the AX1 and AX2 terminals, respectively. While only two auxiliary terminals AX1 and AX2 are shown, any number could be used. As seen, the Auxiliary Digital Circuitry may be coupled to the Tap control bus 136 and instruction register control bus 138 to allow data registers within the Auxiliary Digital Circuitry to be accessed via the TDI 116 and TDO 132 terminals to load/unload data and/or control information. Tap domains are extended to include Auxiliary Digital Circuitry and terminals to enable TAP independent data I/O and/or breakpoint/triggering functions required for embedded debug, emulation, and trace operations. Some standardized examples of using Auxiliary Digital Circuitry and terminals with a Tap domain are given in IEEE standard 5001 (Ref 1), and MIPs EJTAG (Ref 2). Other examples include use of emulation/trace/debug circuitry and emulation 0 (EMU0) and emulation 1 (EMU1) terminals in Texas Instruments DSP IC/core product family. With the exception of the Auxiliary Digital Circuitry and terminals, the Tap domain 402 is similar to Tap Domain 102.

FIG. 5A depicts an example scan path 502 where a number of Tap domain 402 interfaces of ICs 504-510 on a substrate or embedded cores 504-510 within an IC are connected together serially, via their TDI 116 and TDO 132 terminals. The TDO input 312 and TDO output 314 of the scan path 502, along with the TCK 120, TMS 124, TRST 128, AX1 406, and AX2 408 terminals of each Tap Domain 402, are connected to an Extended Digital JTAG Controller 516. The JTAG Controller 516 can serve as a test, debug, trace, emulation, in-system-programming, and/or other application controller.

FIG. 5B depicts an example of an Extended Digital JTAG Controller 516. The JTAG Controller consists of a Tap interface circuit 518 and a computer 320 for controlling the Tap interface circuit. The Tap interface circuit 518 is like the Tap interface circuit 318 except that it includes AX1 520 and AX2 522 I/O terminals for interfacing to the AX1 406 and AX2 408 I/O terminals of Tap domains 402, and a Digital Source/Destination circuit 524. The Digital Source/Destination Circuit 524 is used to control the inputting and/or outputting of signals between the controller's AX1 520 and AX2 522 terminals and the AX1 406 and AX2 408 terminals of Auxiliary Digital Circuitry of the Tap domains 402. The input and/or output operation of the Digital Source/Destination Circuit 524 is controlled by computer 320 via Control Circuitry 532.

As seen in FIG. 5A, the Extended Digital JTAG controller 516 can communicate to the Tap domains 402 using JTAG instruction and data scans, as does the JTAG controller 316 of FIG. 3A. Also, the Extended Digital JTAG controller 516 can communicate to the Auxiliary Digital Circuitry 404 of Tap domains 402 via the AX1 and AX2 terminals 520 and 522. As mentioned, the AX1/AX2 communication may be used for transferring debug, emulation, or trace data or for transferring trigger/breakpoint signals between the Extended Digital controller 516 and the Auxiliary Digital circuitry 404 within the Tap domains.

Figure 6:
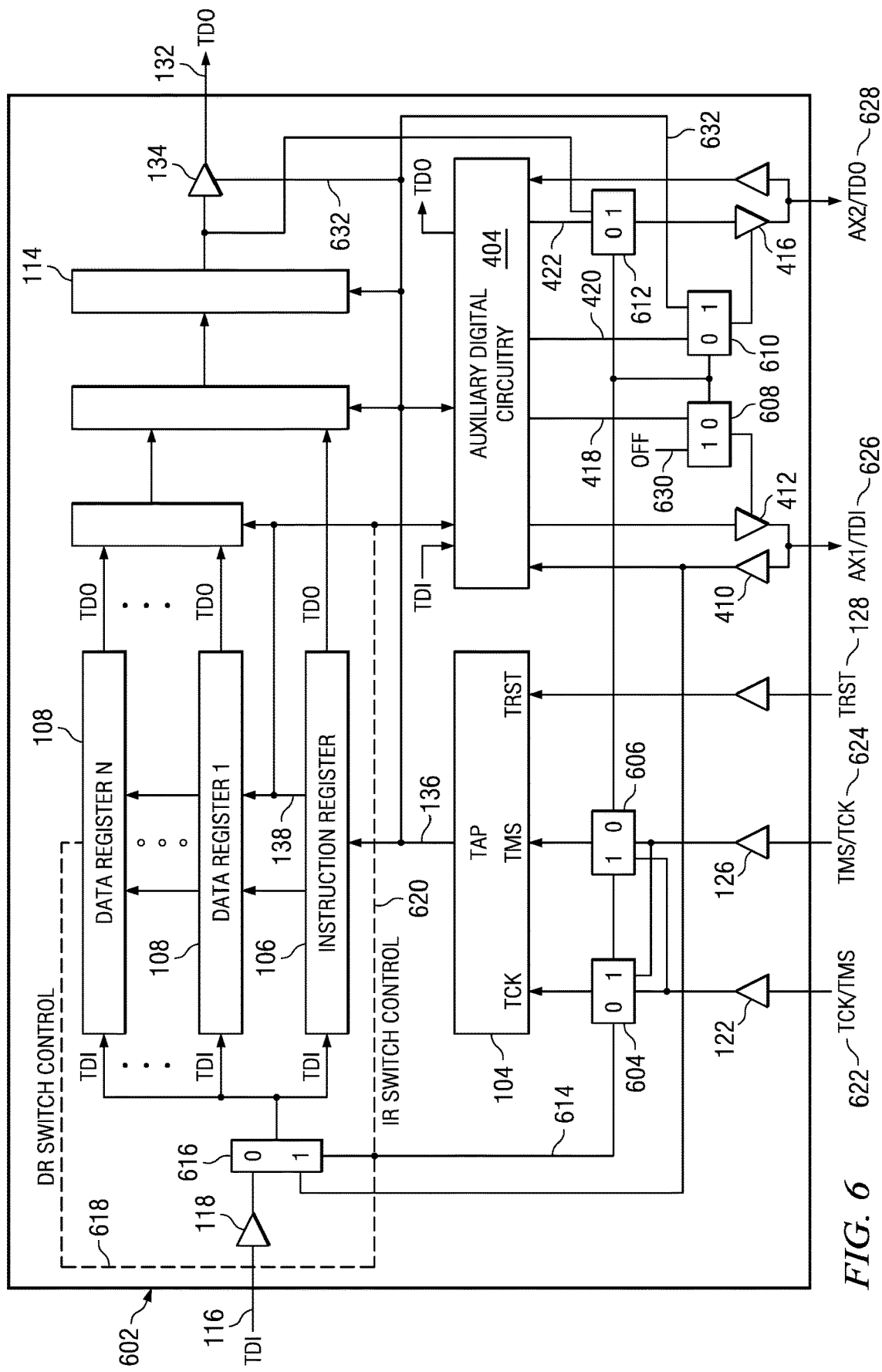
FIG. 6 depicts the Tap domain of FIG. 4 adapted according to the present disclosure.

FIG. 6 depicts an example of an IEEE 1149.1 Tap domain 602 of the present disclosure. Tap domain 602 is similar to the Tap domain 402 of FIG. 4 with the following differences.

The TCK 120, TMS 124, AX1 406, and AX2 408 terminals of FIG. 4 have been renamed to TCK/TMS 622, TMS/TCK 624, AX1/TDI 626, and AX2/TDO 628, respectively, to indicate the dual use of the terminals.

A two input multiplexer 604 has been inserted into the TCK/TMS 622 input path to the Tap controller 104. One input of the multiplexer 604 is coupled to the output of TCK/TMS buffer 122, the other input is coupled to the output of TMS/TCK buffer 126, and the output of the multiplexer is coupled to the TCK input of Tap controller 104. The control input to the multiplexer is connected to a switch control signal 614.

A two input multiplexer 606 has been inserted into the TMS/TMS 624 input path to the Tap controller 104. One input of the multiplexer 606 is coupled to the output of TCK/TMS buffer 122, the other input is coupled to the output of TMS/TCK buffer 126, and the output of the multiplexer is coupled to the TMS input of Tap controller 104. The control input to the multiplexer is connected to the switch control signal 614.

A two input multiplexer 608 has been inserted into the AX1 I/O control signal output path 418 from Auxiliary Digital Circuitry 404. One input of multiplexer 608 is coupled to the I/O control signal 418, the other input is coupled to an OFF signal 630, and the output of the multiplexer is coupled to the 3-state input of AX1/TDI output buffer 412. The OFF signal is set to a state that disables the output of buffer 412. The control input to the multiplexer is connected to the switch control signal 614.

A two input multiplexer 610 has been inserted into the AX2 I/O control signal output path 420 from Auxiliary Digital Circuitry 404. One input of the multiplexer 610 is coupled to the output of I/O control signal 420, the other input is coupled to the TDO output enable signal 632 of Tap controller bus 136 (i.e. the signal that enables the TDO buffer 134 during JTAG shift operations), and the output of the multiplexer is coupled to the 3-state input of AX2/TDO output buffer 416. The control input to the multiplexer is connected to the switch control signal 614.

A two input multiplexer 612 has been inserted into the AX2 output signal path 422 from Auxiliary Digital Circuitry 404. One input of the multiplexer 612 is coupled to the AX2 output signal 422 of Auxiliary Digital Circuitry 404, the other input is coupled to the output of TDO register 114, and the output of the multiplexer is coupled to the input of the AX2/TDO 3-state output buffer 416. The control input to the multiplexer is connected to the switch control signal 614.

A two input multiplexer 616 has been inserted into the TDI input path 116. One input of the multiplexer 616 is coupled to the output of TDI buffer 118, the other input is coupled to the output of the AX1/TDI input buffer 410, and the output of the multiplexer is coupled to the TDI inputs of the instruction register 106 and data registers 108. The control input to the multiplexer is connected to the switch control signal 614.

The switch control signal 614 can be controlled, by design choice, from either a data register 108 output (indicated as dotted line output 618), or an instruction register 106 output (indicated as dotted line output 620 from the instruction register output bus 138). If controlled by a data register 108, switch control signal 614 is set high or low by a JTAG data scan operation. If controlled by the instruction register 106, switch control signal 614 is set high or low by a JTAG instruction scan operation.

In the Tap domain 602 example of FIG. 6, when the switch control signal 614 is set low, multiplexer 604 couples the TCK/TMS terminal 622 to the TCK input of Tap controller 104, multiplexer 606 couples the TMS/TCK terminal 624 to the TMS input of Tap controller 104, multiplexer 608 couples the AX1 I/O control signal 418 to the 3-state control input of AX1/TDI buffer 412, multiplexer 610 couples the AX2 I/O control signal 420 to the 3-state control input of AX2/TDO buffer 416, multiplexer 612 couples the AX2 output signal 422 to the input of AX2 buffer 416, and multiplexer 616 couples the output of the TDI input buffer 118 to the TDI inputs of the data registers 108 and instruction register 106. In this configuration, the Tap domain 602 operates like the Tap domain 402 of FIG. 4.

When the switch control signal 614 is set high, multiplexer 604 couples the TMS/TCK signal 624 to the TCK input of Tap controller 104, multiplexer 606 couples the TCK/TMS signal 622 to the TMS input of Tap controller 104, multiplexer 608 couples the OFF signal 630 to the 3-state control input of AX1/TDI buffer 412, multiplexer 610 couples the TDO output enable signal 632 to the 3-state control input of AX2/TDO buffer 416, multiplexer 612 couples the output of TDO register 114 to the input of AX2/TDO buffer 416, and multiplexer 616 couples the output of AX1/TDI buffer 410 to the TDI inputs of the data registers 108 and instruction register 106. In this configuration, the Tap domain 602 departs from the operation mode of Tap domain 402 of FIG. 4 and enters the direct scan access operation mode of the present embodiment.

Figure 7A:
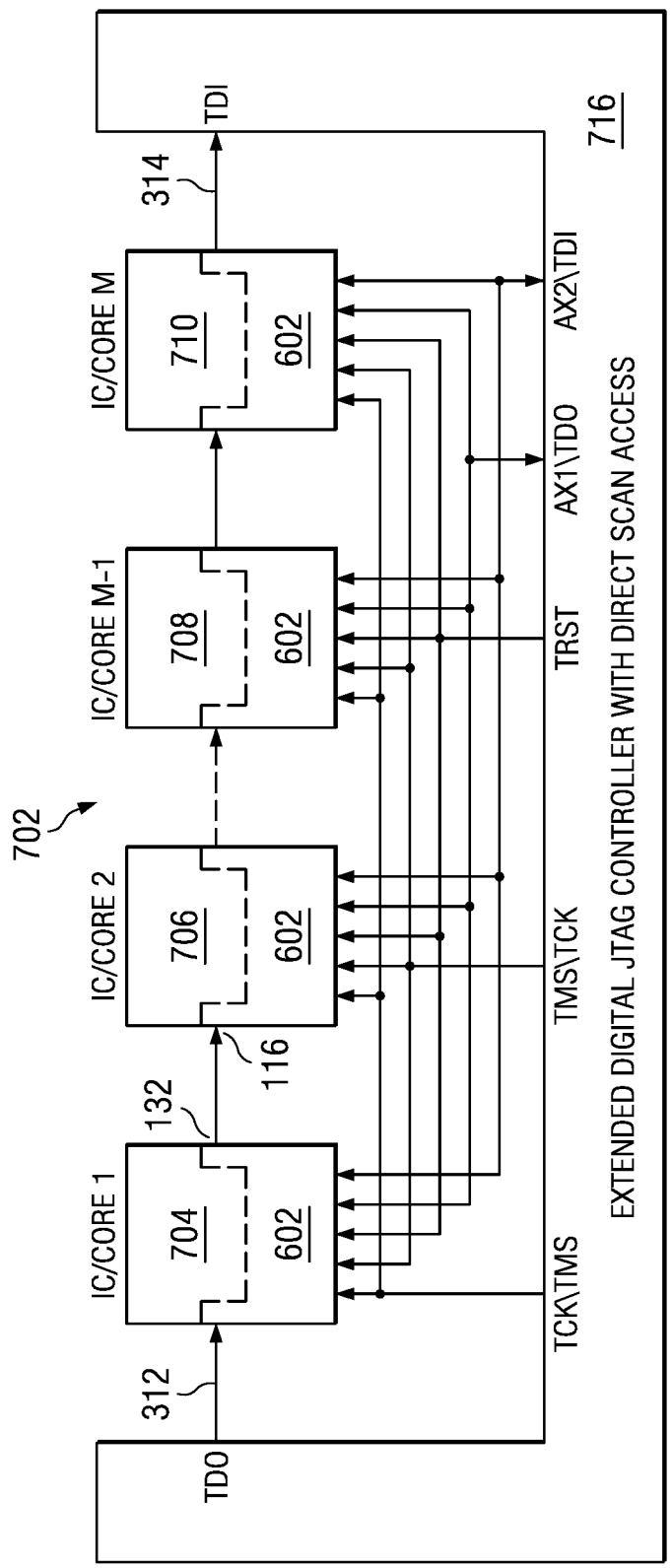
FIG. 7A depicts a JTAG controller coupled to a scan path of ICs/cores each including the Tap domain of FIG. 6 according to the present disclosure.

FIG. 7A depicts an example scan path 702 where a number of Tap domain 602 interfaces of ICs 704-710 on a substrate or embedded cores 704-710 within an IC are connected together serially, via their TDI 116 and TDO 132 terminals. The TDO input 312 and TDO output 314 of the scan path 702, along with the TCK/TMS 622, TMS/TCK 624, TRST 128, AX1/TDI 626, and AX2/TDO 628 terminals of each Tap Domain 602, are connected to an Extended Digital JTAG Controller with Direct Scan Access 716. The JTAG Controller 716 can serve as a test, debug, trace, emulation, in-system-programming, and/or other application controller. The JTAG controller 716 can access these applications using the conventional JTAG daisy-chain approach or the direct scan access approach of the present embodiment.

Figure 7B:
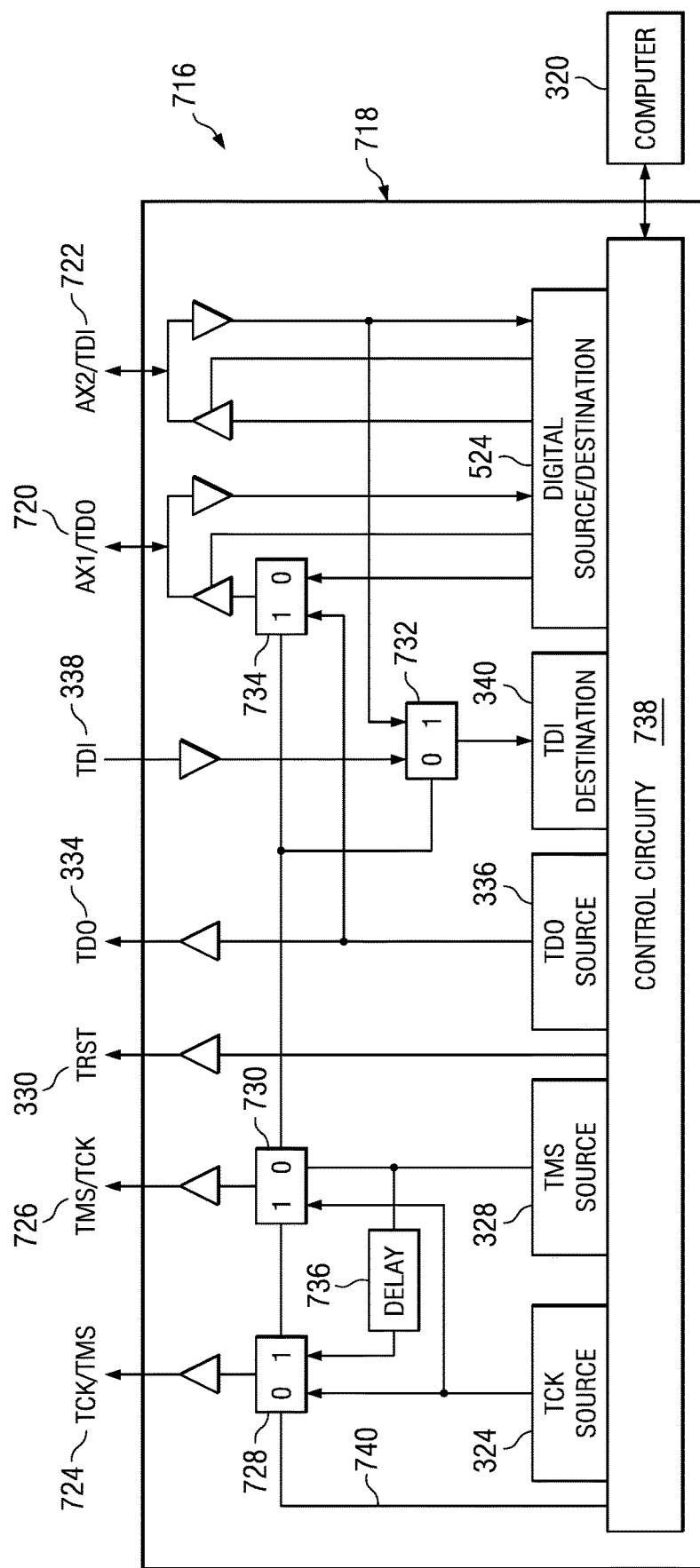
FIG. 7B depicts the JTAG controller of FIG. 7A in more detail according to the present disclosure.

FIG. 7B depicts an example of an Extended Digital JTAG Controller with Direct Scan Access 716. The JTAG Controller 716 consists of a Tap interface circuit 718 and a computer 320 for controlling the Tap interface circuit. The Tap interface circuit 718 is like the Tap interface circuit 518 of FIG. 5B with the following differences.

The TCK 322, TMS 326, AX1 520, and AX2 522 terminals of the controller of FIG. 5B have been renamed to TCK/TMS 724, TMS/TCK 726, AX1/TDO 720, and AX2/TDI 722, respectively, to indicate the dual use of the terminals by the present embodiment. The TCK/TMS terminal 724 couples to the TCK/TMS terminals 622 of Tap domains 602. The TMS/TCK terminal 726 couples to the TMS/TCK terminals 624 of Tap domains 602. The AX1/TDO terminal 720 couples to the AX1/TDI terminals 626 of Tap domains 602. The AX2/TDI 722 terminal couples to the AX2/TDO terminals of Tap domains 602. The TDO 334, TDI 338, and TRST 330 terminals are coupled to Tap Domain 602 terminals TDI 116, TDO 132, and TRST 128 respectively.

A two input multiplexer 728 has been inserted into the TCK/TMS 724 output path. One input of the multiplexer is coupled to the output of TCK Source 324, the other input is coupled, via delay circuit 736, to the output of TMS Source 328, and the output of the multiplexer is coupled to the TCK/TMS terminal 724. The control input to the multiplexer is connected to control signal 740 from Control Circuitry 738.

A two input multiplexer 730 has been inserted into the TMS/TCK 726 output path. One input of the multiplexer is coupled to the output of TCK Source 324, the other input is coupled to the output of TMS Source 328, and the output of the multiplexer is coupled to the TMS/TCK terminal 726. The control input to the multiplexer is connected to control signal 740 from Control Circuitry 738.

A two input multiplexer 732 has been inserted into the TDI 338 input path. One input of the multiplexer is coupled to the TDI 338 terminal, the other input is coupled to the AX2/TDI 722 terminal, and the output of the multiplexer is coupled to the TDI Destination 340. The control input to the multiplexer is connected to control signal 740 from Control Circuitry 738.

A two input multiplexer 734 has been inserted into the AX1/TDO 720 output path. One input of the multiplexer is coupled to the output of TDO Source 336, the other input is coupled to the output of Digital Source/Destination 524, and the output of the multiplexer is coupled to the AX1/TDO 720 terminal. The control input to the multiplexer is connected to control signal 740 from Control Circuitry 738.

Control Circuitry 738 provides, in addition to the functionality of Control Circuitry 532, the control signal 740 for regulating the settings of multiplexers 728-734, in response to input from computer 320.

As seen in the Tap interface circuit 718 example of FIG. 7B, when the control signal 740 is set low the multiplexers 728-734 are controlled such that the TCK source 324 is coupled to the TCK/TMS terminal 724, the TMS source 328 is coupled to the TMS/TCK terminal 726, the TDI Destination 340 is coupled to the TDI terminal 338, and the Digital Source/Destination 524 is coupled to the AX1/TDO terminal 720. In this mode, the Tap Interface Circuit 718 operates the same as the Tap Interface Circuit 518 of FIG. 5B to access the Tap domains 602 of scan path 702 in a daisy-chain fashion.

When the control signal 740 is set high the multiplexers 728-734 are controlled such that the TMS source 328 is coupled to the TCK/TMS terminal 724, the TCK source 324 is coupled to the TMS/TCK terminal 726, the TDI Destination 340 is coupled to the AX2/TDI terminal 722, and the TDO source 336 is coupled to the AX1/TDO terminal 720. In this mode, the Tap Interface Circuit 718 operates to access the selected Tap domain 602 using the direct scan access approach of the present embodiment. The selected Tap domain 602 will be configured for direct scan access by its Switch Control signal 614 being set high. Non-selected Tap domains 602 will remain in the daisy-chain TDI to TDO access mode by their Switch Control signal 614 being set low. During direct scan access, the selected Tap domain 602 will input serial data at its AX1/TDI terminal 626 from the AX1/TDO terminal 720 of JTAG controller 716, and will output serial data from its AX2/TDO terminal 628 to the AX2/TDI terminal 722 of the JTAG controller 716 during instruction and data scan operations. Only the selected Tap domain will receive the correct TMS and TCK inputs for performing instruction and data scans. Non-selected Tap domains will receive input on TMS and TCK but the input will not affect the state of the non-selected Tap domains.

Figure 7C:
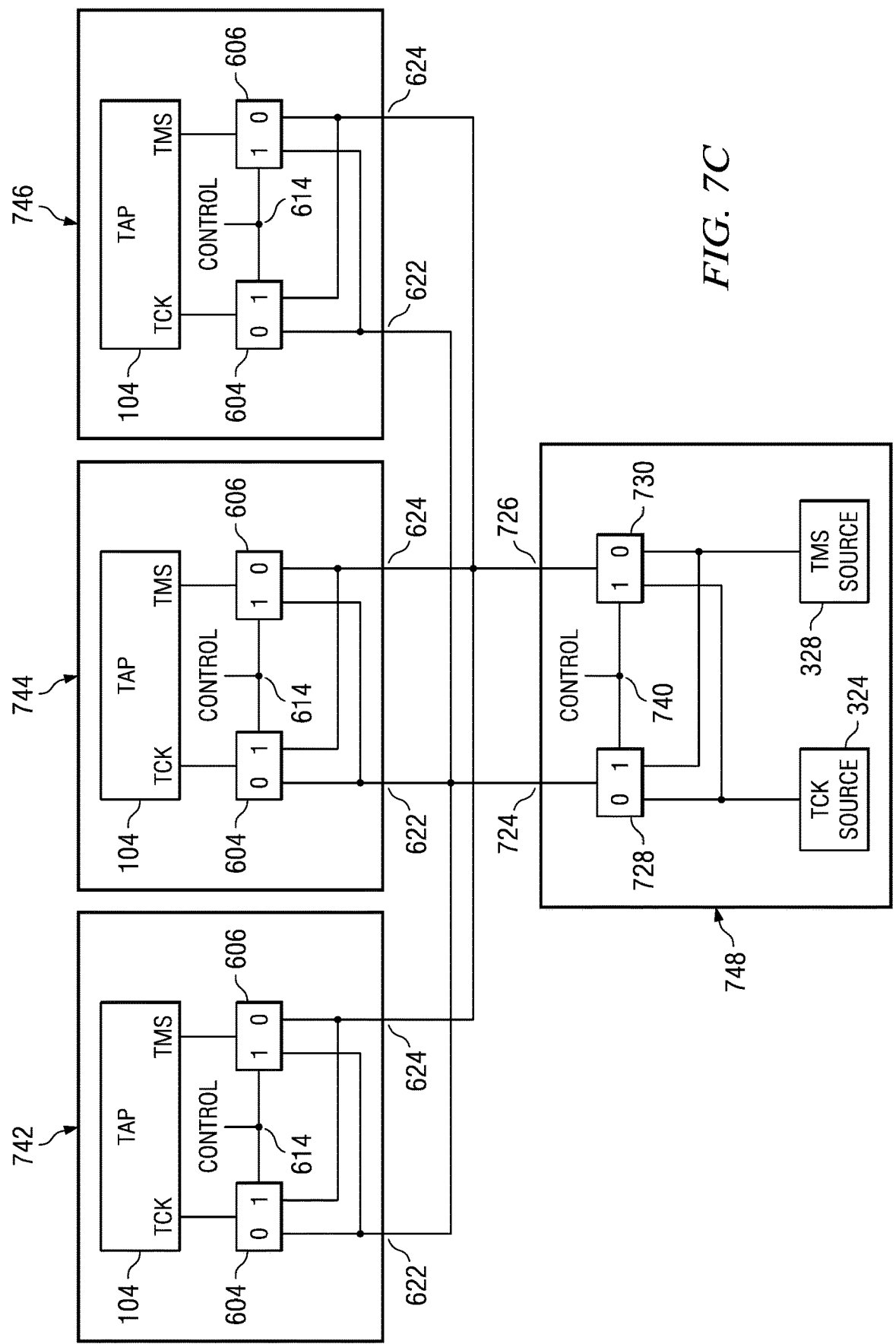
FIG. 7C depicts TCK and TMS signal multiplexing in Tap domains of FIG. 6 and the JTAG controller of FIG. 7B according to the present disclosure.

FIG. 7C depicts TMS and TCK control inputs to selected and non-selected Tap domains. Circuit blocks 742, 744, and 746 represent simplified portions of Tap domains 602 in IC/Core 704-708 and circuit block 748 represents a simplified portion of JTAG controller 716. Each Tap domain circuit block 742-746 consists of a Tap controller 104 and multiplexers 604 and 606. JTAG controller circuit block 748 consists of TCK and TMS sources 324 and 328 and multiplexers 728 and 730. During daisy-chain access mode the Switch Control signal 614 of each Tap domain circuit block 742-746 is set low and the control signal 740 of the JTAG controller circuit block is set low. With this setting the multiplexers are configured to allow the TCK source 324 to drive the TCK input of each Tap controller 104 and the TMS source 328 to drive the TMS input of each Tap controller 104.

When direct scan access of say Tap domain circuit block 744 is desired, its Switch Control signal 614 will be set high and the Control signal 740 of the JTAG controller circuit block 748 will be set high. The Switch Control signal 614 of the other Tap domain circuit blocks 742 and 746 will remain low. In this configuration, the multiplexers of blocks 744 and 748 allow the TCK source 324 and TMS source 328 to correctly drive the TCK and TMS inputs, respectively, of the Tap controller 104 of block 744 to perform instruction and data scan operations. The low on the Switch Control signals 614 to multiplexers 604 and 606 of blocks 742 and 746 cause the TCK and TMS inputs of the Tap controllers 104 of those blocks to be driven incorrectly by the TMS source 328 and TCK source 324, respectively, of JTAG controller block 748. As will be described later in regard to the timing diagrams of FIGS. 11 and 12, an incorrectly driven Tap controller 104 will not respond to TCK and TMS inputs, and will remain in the Run Test/Idle state. Thus from FIG. 7C it is seen that the TMS and TCK multiplexing in the Tap domains 742-746 and JTAG controller 748 enable a selected Tap domain to receive the correct JTAG TCK and TMS protocol to perform instruction and data scans while non-selected Tap domains receive an incorrect JTAG TCK and TMS protocol and remain inactive in the Run Test/Idle state.

Figure 8:
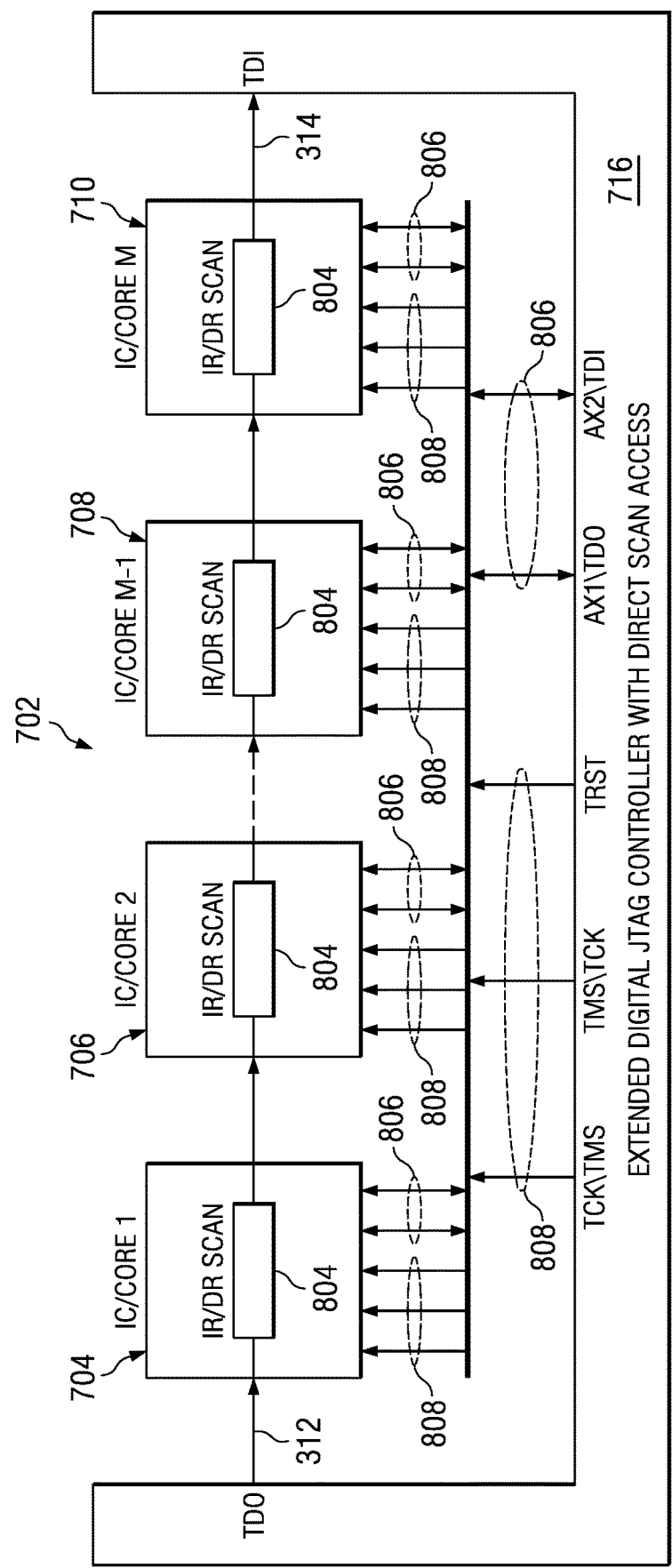
FIG. 8 depicts the FIG. 6 Tap domains being controlled by the JTAG controller of FIG. 7B to operate in a daisy-chain scan access mode according to the present disclosure.

FIG. 8 depicts the JTAG controller 716 performing a daisy-chained JTAG instruction or data scan operation through Tap domains 602 of ICs/cores 704-710 in scan path 702. The instruction 106 or data 108 register of each IC/core is indicated by register element 804. Bus 808 includes the control signals between the JTAG controller 716 and Tap controller 104 of Tap domains 602. Bus 806 includes the auxiliary digital I/O signals between the JTAG controller 716 and Auxiliary Digital Circuitry 404 of Tap domains 602. In this configuration, the auxiliary digital signals may be used to perform conventional data I/O, or trigger/breakpoint operations, such as those described in the previously referenced IEEE Standard 5001.

Figure 9A:
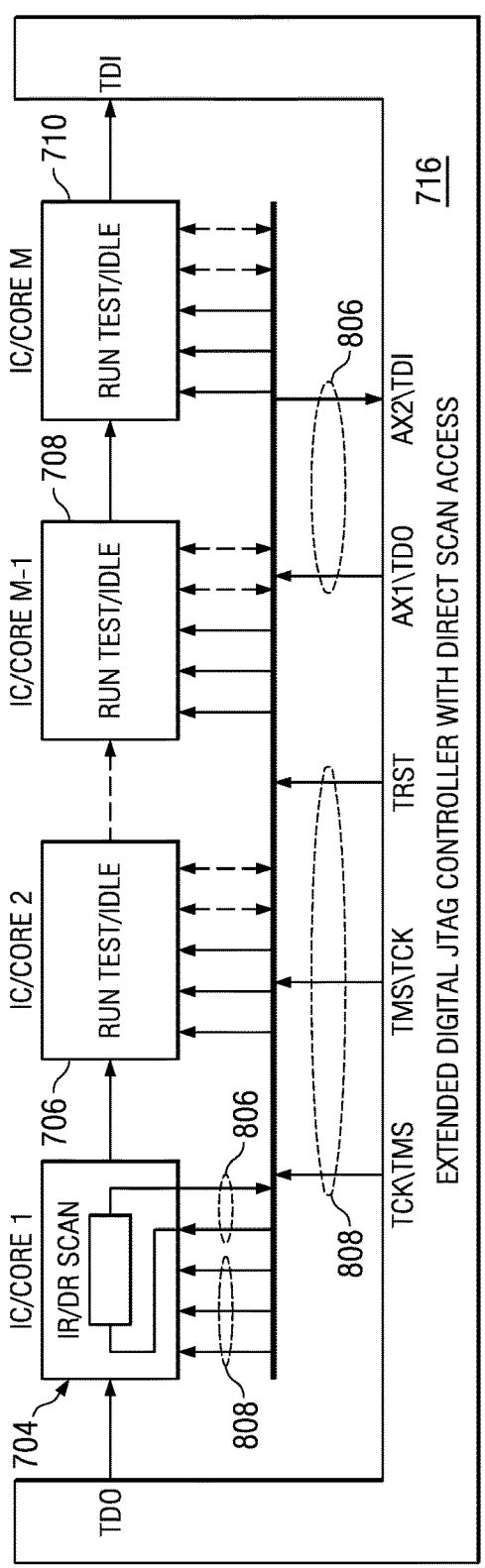

FIG. 9A depicts scan path 702 configured to perform a direct scan access operation between the JTAG controller 716 and an instruction or data register within Tap domain 602 of IC/core 704. To achieve this operation the Switch Control signal 614 in Tap domain 602 of IC/core 704 is set high, the Switch Control signals 614 of Tap domains 602 of IC/cores 706-710 are set low, and the control signal 740 of the JTAG controller 716 is set high. During this direct scan access operation, the Tap controllers 104 of Tap domains 602 of IC/cores 706-710 are forced to go to and remain in the Run Test/Idle state. The AX1/TDI 626 and AX2/TDO 628 terminals of IC/cores 706-710 are disabled, as indicated by dotted line, to allow the AX1/TDI 626 and AX2/TDO 628 terminals of the selected IC/core 704 to operate as JTAG TDI and TDO terminals.

Figure 9B:
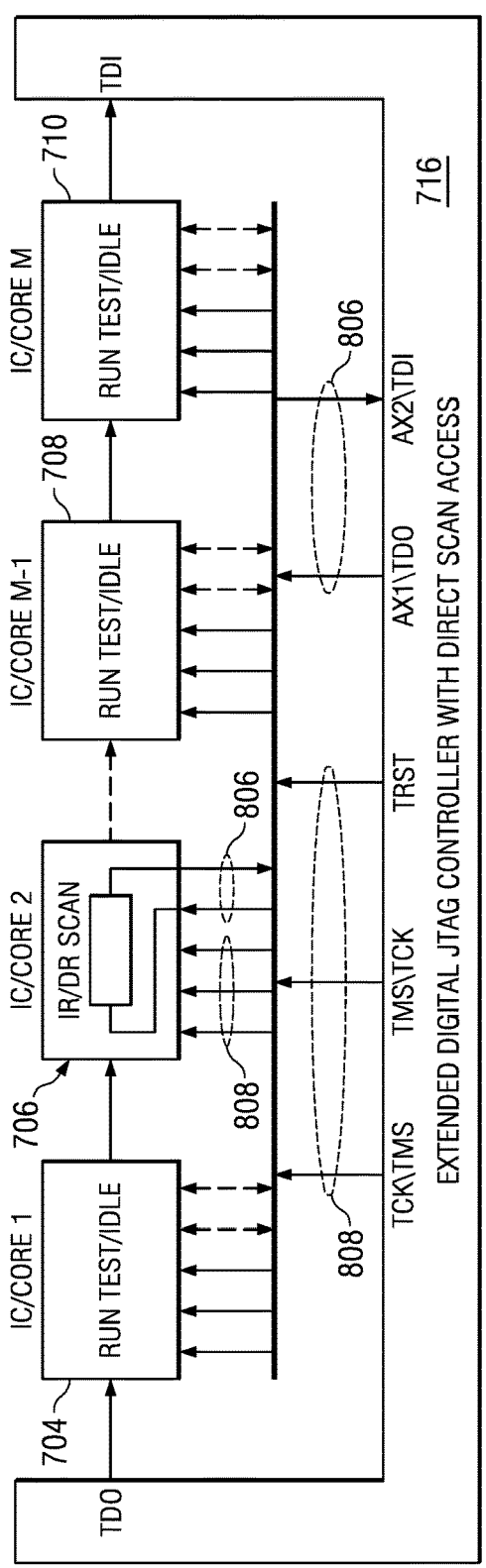

FIG. 9B depicts scan path 702 configured to perform a direct scan access operation between the JTAG controller 716 and an instruction or data register within Tap domain 602 of IC/core 706. To achieve this operation the Switch Control signal 614 in Tap domain 602 of IC/core 706 is set high, the Switch Control signals 614 of Tap domains 602 of IC/cores 704, 708, and 710 are set low, and the control signal 740 of the JTAG controller 716 is set high. During this direct scan access operation, the Tap controllers 104 of Tap domains 602 of IC/cores 704, 708, and 710 are forced to go to and remain in the Run Test/Idle state. The AX1/TDI 626 and AX2/TDO 628 terminals of IC/cores 704, 708, and 710 are disabled, as indicated by dotted line, to allow the AX1/TDI 626 and AX2/TDO 628 terminals of the selected IC/core 706 to operate as JTAG TDI and TDO terminals.

FIG. 9C depicts scan path 702 configured to perform a direct scan access operation between the JTAG controller 716 and an instruction or data register within Tap domain 602 of IC/core 708. To achieve this operation the Switch Control signal 614 in Tap domain 602 of IC/core 708 is set high, the Switch Control signals 614 of Tap domains 602 of IC/cores 704, 706, and 710 are set low, and the control signal 740 of the JTAG controller 716 is set high. During this direct scan access operation, the Tap controllers 104 of Tap domains 602 of IC/cores 704, 706, and 710 are forced to go to and remain in the Run Test/Idle state. The AX1/TDI 626 and AX2/TDO 628 terminals of IC/cores 704, 706, and 710 are disabled, as indicated by dotted line, to allow the AX1/TDI 626 and AX2/TDO 628 terminals of the selected IC/core 708 to operate as JTAG TDI and TDO terminals.

FIG. 9D depicts scan path 702 configured to perform a direct scan access operation between the JTAG controller 716 and an instruction or data register within Tap domain 602 of IC/core 710. To achieve this operation the Switch Control signal 614 in Tap domain 602 of IC/core 710 is set high, the Switch Control signals 614 of Tap domains 602 of IC/cores 704-708 are set low, and the control signal 740 of the JTAG controller 716 is set high. During this direct scan access operation, the Tap controllers 104 of Tap domains 602 of IC/cores 704-708 are forced to go to and remain in the Run Test/Idle state. The AX1/TDI 626 and AX2/TDO 628 terminals of IC/cores 704-708 are disabled, as indicated by dotted line, to allow the AX1/TDI 626 and AX2/TDO 628 terminals of the selected IC/core 710 to operate as JTAG TDI and TDO terminals.

Figure 10:
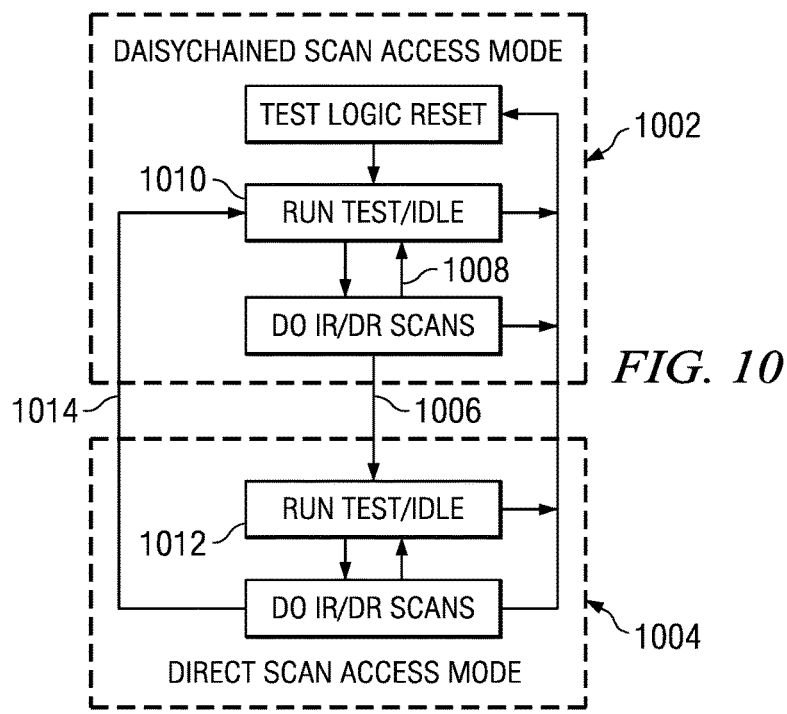
FIG. 10 depicts the Tap domain of FIG. 6 transitioning between daisy-chain and direct scan access modes according to the present disclosure.

FIG. 10 depicts the daisy-chain and direct scan access modes of the Tap domains 602 of FIGS. 6 through 9. At power up or following a TRST input, the Tap domains 602 will be in the daisy-chain scan mode 1002 and all will operate together through Tap states to perform instruction and data scan operations as shown in FIG. 8. When direct scan access is desired to a selected Tap domain 602, the Switch control signal 614 of that Tap domain will be set high during an instruction or data scan update operation (i.e. in the Update-IR or Update-DR states of FIG. 2).

In response to Switch control signal 614 being set high, the Tap domains 602 will transition to the Run Test/Idle state. The non-selected Tap domains 602 will go to the Run Test/Idle state 1010 of the daisy-chain mode 1002 via transition path 1008. The selected Tap domain 602 will go to the Run Test/Idle state 1012 of the direct scan access mode 1004 via transition path 1006. While the Tap domains are in the Run Test/Idle state, the control signal 740 of the JTAG controller 716 is set high to issue a correct TCK and TMS protocol to the selected Tap domain 602, and an incorrect TCK and TMS protocol to the non-selected Tap domains 602.

The correct TCK and TMS protocol received by the selected Tap domain 602 enables the Tap domains to move from the Run Test/Idle state 1012 to perform direct instruction and data scan access operations, as indicated in FIGS. 9A-9D. The incorrect TCK and TMS protocol received by the non-selected Tap domains 602 during the direct scan access of the selected Tap domain 602 causes the non-selected Tap domains to remain in the Run Test/Idle state 1010, as indicated in FIG. 9A-9D.

Following the completion of the direct scan access of the selected Tap domain 602, its Switch control signal 614 is set low during the Update-IR or Update-DR state of an instruction or data scan operation respectively. In response the low on the Switch control signal 614, the selected Tap domain transitions to the Run Test/Idle state 1010 to join the non-selected Tap domains in the daisy-chain scan mode 1002 as indicated by transition 1014. The Run Test/Idle states 1010 and 1012 are one and the same state. They are shown as separate states only to indicate the state as it would appear when the Tap domains 602 are in either the daisy-chain or direct scan access modes. After the selected Tap domain has rejoined the non-selected Tap domains in the Run Test/Idle state 1010, the control signal 740 of the JTAG controller 716 is set low to again issue a correct TCK and TMS protocol to all Tap domains 602 in the daisy-chain scan access mode 1002. All Tap domains can now operate in the daisy-chain scan access mode to perform instruction and data scan operations, as indicated in FIG. 8.

Timing example 1102 of FIG. 11 shows the Tap controller 104 state sequence of an instruction register scan operation being used to set the Switch Control signal 614 of a selected Tap domain 602 high to switch from the daisy-chain scan access mode 1002 to the direct scan access mode 1004. The Pause indication 1108 in the Run Test/Idle state is where the JTAG controller 716 sets the control signal 740 high to allow outputting the direct scan access TCK and TMS protocol to the selected Tap domain 602.

Timing example 1104 of FIG. 11 shows the Tap controller 104 operating in the direct scan access mode 1004. Note in the timing that TMS/TCK 624 operates as the TCK input to the selected Tap domain and TCK/TMS 622 operates as the TMS input to the selected Tap domain. Also, note that the delay 1112 between the TCK/TMS and TMS/TCK signals, introduced by the delay circuit 736 of FIG. 7B, causes all rising edge transitions on the TCK/TMS signal 622 to occur while the TMS/TCK signal 624 is at a logic low level. Forcing TMS/TCK low during all TCK/TMS rising edges causes the non-selected Tap domains to remain in the Run Test/Idle state of FIG. 2. This is the incorrect TCK and TMS protocol previously mentioned in regard to FIG. 7C.

Timing example 1106 of FIG. 11 shows the Tap controller 104 state sequence of an instruction register scan operation being used to set the Switch Control signal 614 of the selected Tap domain 602 low to switch from the direct scan access mode 1004 to the daisy-chain scan access mode 1002. The Pause indication 1110 in the Run Test/Idle state is where the JTAG controller 716 sets the control signal 740 low to allow outputting the daisy-chain scan access TCK and TMS protocol to all Tap domains 602.

Figure 12:
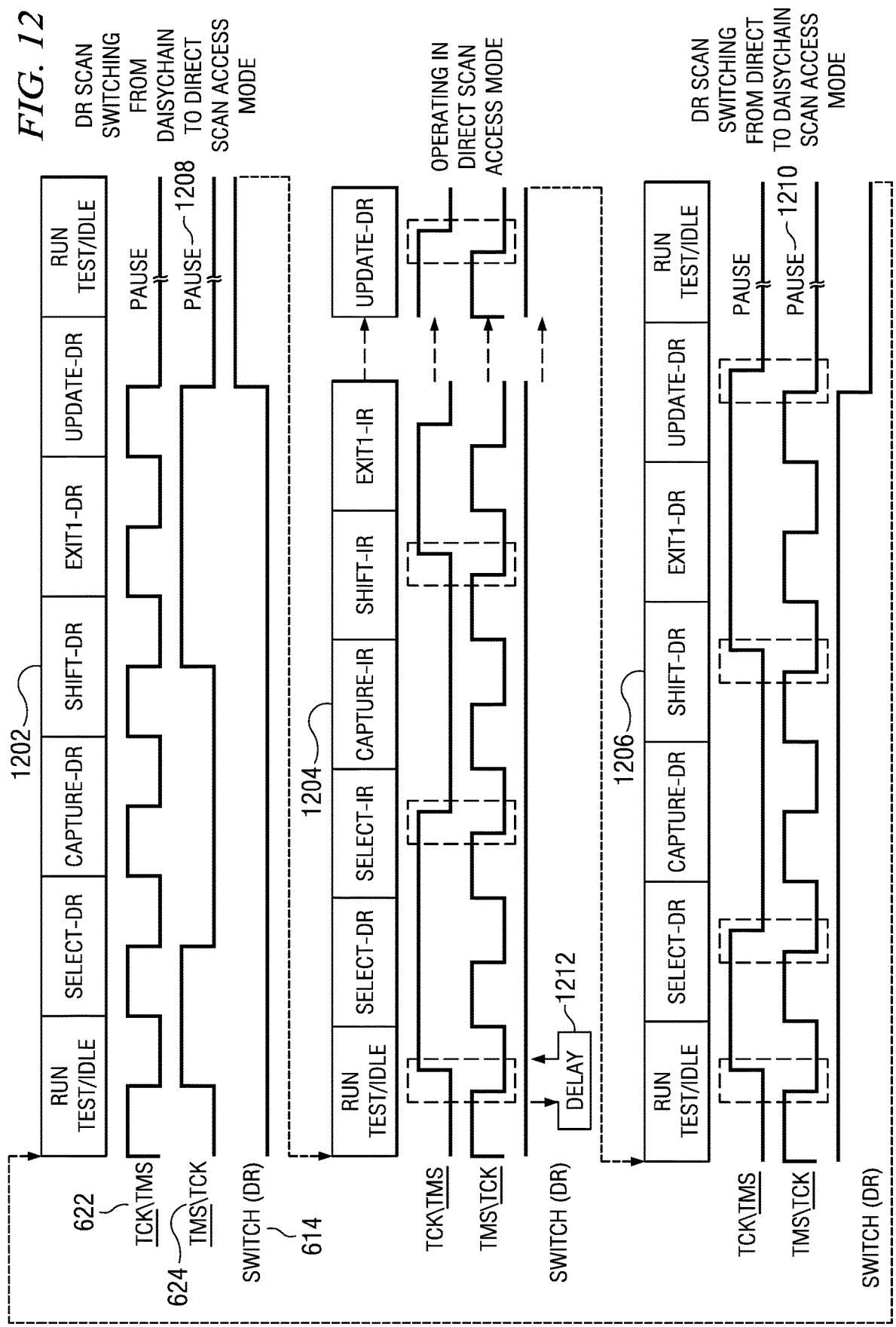
FIG. 12 depicts timing of JTAG data register scan operations being used to switch Tap domains between daisy-chain and direct scan access modes according to the present disclosure.

Timing example 1202 of FIG. 12 shows the Tap controller 104 state sequence of a data register scan operation being used to set the Switch Control signal 614 of a selected Tap domain 602 high to switch from the daisy-chain scan access mode 1002 to the direct scan access mode 1004. Again, the Pause indication 1208 in the Run Test/Idle state is where the JTAG controller 716 sets the control signal 740 high to allow outputting the direct scan access TCK and TMS protocol to the selected Tap domain 602.

Timing example 1204 of FIG. 12 shows the Tap controller 104 operating in the direct scan access mode 1004. Again, the TMS/TCK 624 signal operates as the TCK input to the selected Tap domain and TCK/TMS 622 operates as the TMS input to the selected Tap domain. Also again, the delay 1212 between the TCK/TMS and TMS/TCK signals causes all rising edge transitions on the TCK/TMS signal 622 to occur while the TMS/TCK signal 624 is at a logic low level, forcing non-selected Tap domains 602 to remain the Run Test/Idle state.

Timing example 1206 of FIG. 12 shows the Tap controller 104 state sequence of a data register scan operation being used to set the Switch Control signal 614 of the selected Tap domain 602 low to switch from the direct scan access mode 1004 to the daisy-chain scan access mode 1002. Again, the Pause indication 1210 in the Run Test/Idle state is where the JTAG controller 716 sets the control signal 740 low to allow outputting the daisy-chain scan access TCK and TMS protocol to all Tap domains 602.

Figure 13:
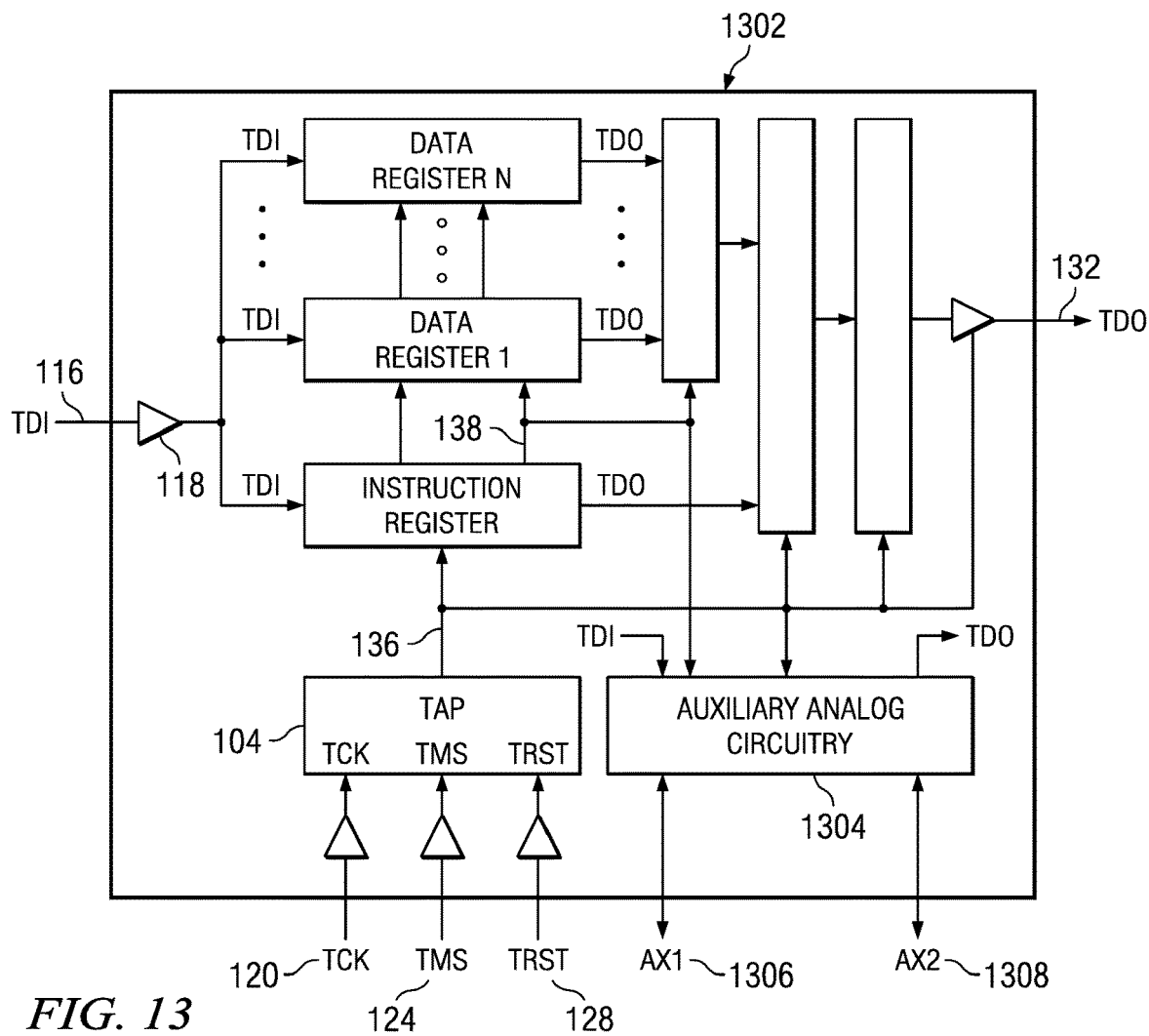
FIG. 13 depicts an extended Tap domain that includes auxiliary analog circuitry and I/O terminals.

FIG. 13 depicts an example of an IEEE 1149.1 Tap domain 1302 which has been extended to include Auxiliary Analog Circuitry 1304 and auxiliary terminals AX1 1306 and AX2 1308. The AX1 1306 and AX2 1308 terminals are coupled to the Auxiliary Analog Circuitry 1304. While only two auxiliary terminals (AX1 and AX2) are shown, any number could be used. As seen, the Auxiliary Analog Circuitry may be coupled to the Tap control bus 136 and instruction register control bus 138 to allow data registers within the Auxiliary Analog Circuitry to be accessed via the TDI 116 and TDO 132 terminals to load/unload data and/or control information. Tap domains are extended to include Auxiliary Analog Circuitry and terminals to enable analog testing functions. One example of using Auxiliary Analog Circuitry and terminals with a Tap domain is given in IEEE standard 1149.4 (Ref 3). With the exception of the Auxiliary Analog Circuitry and terminals, the Tap domain 1302 is similar to Tap Domain 102.

Figure 14A:
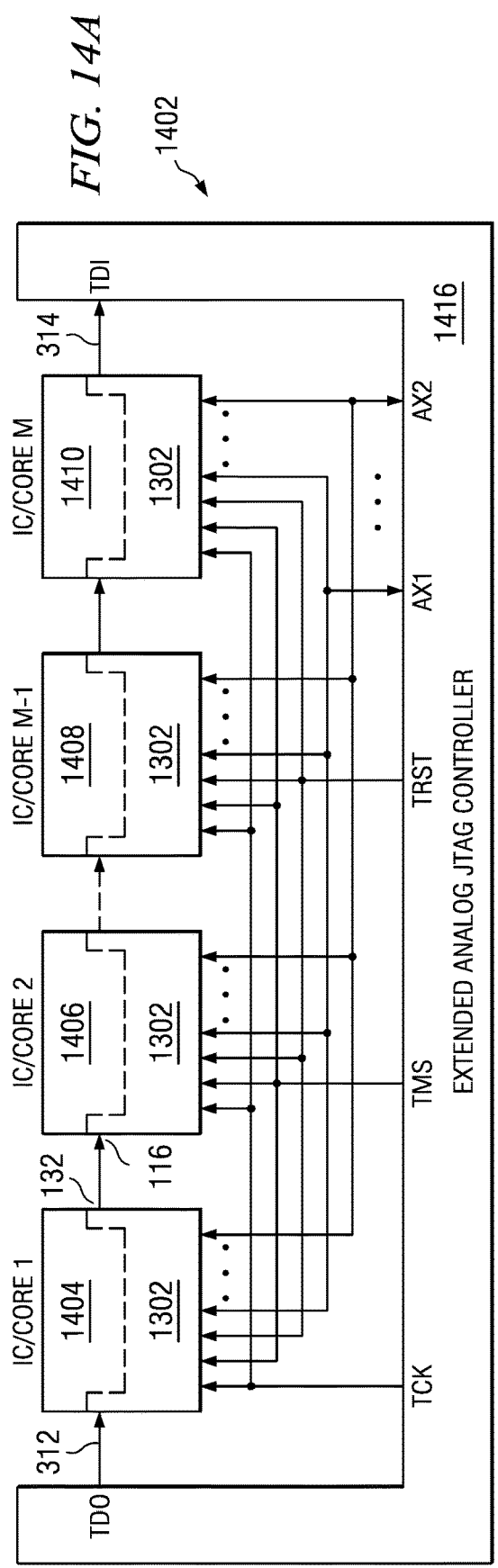
FIG. 14A depicts a JTAG controller coupled to a scan path of ICs/cores each including the Tap domain of FIG. 13.

FIG. 14A depicts an example scan path 1402 where a number of Tap domain 1302 interfaces of ICs/cores 1404-1410 are connected together serially, via their TDI 116 and TDO 132 terminals. The TDO input 312 and TDO output 314 of the scan path 1402, along with the TCK 120, TMS 124, TRST 128, AX1 1306, and AX2 1308 terminals of each Tap Domain 1302, are connected to an Extended Analog JTAG Controller 1416. The JTAG Controller 1416 can serve as a test, debug, trace, emulation, in-system-programming, analog test, and/or other application controller.

Figure 14B:
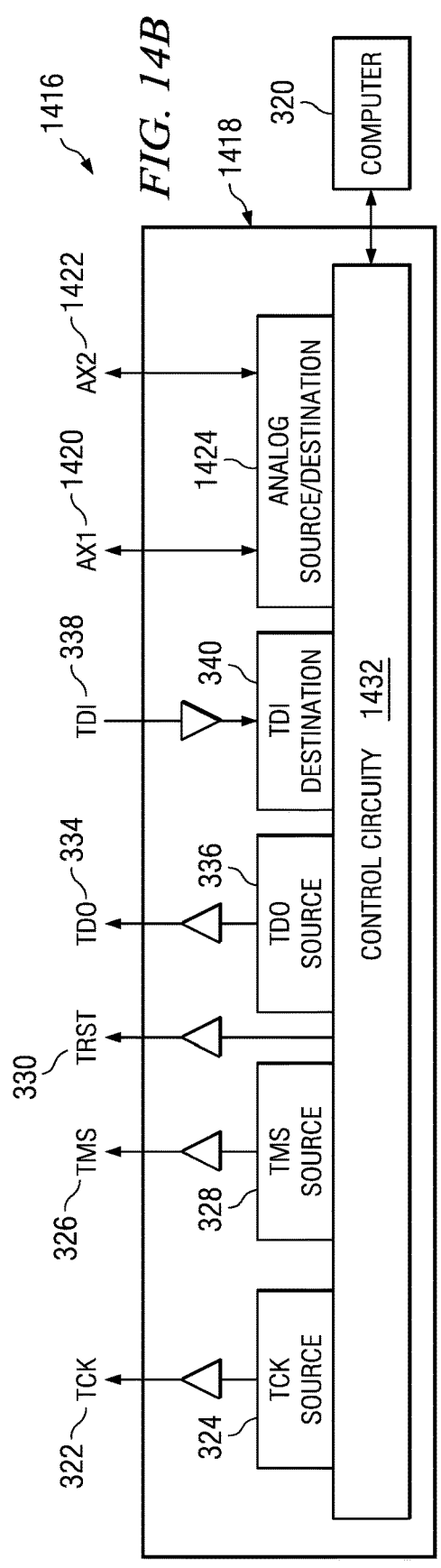
FIG. 14B depicts the JTAG controller of FIG. 13A in more detail.

FIG. 14B depicts an example of an Extended Analog JTAG Controller 1416. The JTAG Controller consists of a Tap interface circuit 1418 and a computer 320 for controlling the Tap interface circuit. The Tap interface circuit 1418 is like the Tap interface circuit 318 except that it includes AX1 1420 and AX2 142 terminals for interfacing to the AX1 1306 and AX2 1308 terminals of Tap domains 1302, and an Analog Source/Destination circuit 1424. The Analog Source/Destination Circuit 1424 is used to control the inputting and/or outputting of analog current and/or voltage test signals between the controller's AX1 1420 and AX2 1422 terminals and the AX1 1306 and AX2 1308 terminals of Auxiliary Analog Circuitry of the Tap domains 1302. The input and/or output operation of the Analog Source/Destination Circuit 1424 is controlled by computer 320 via Control Circuitry 1432.

As seen in FIG. 14A, the Extended Analog JTAG controller 1416 can communicate to the Tap domains 1302 using JTAG instruction and data scans, as does the JTAG controller 316 of FIG. 3A. Also, the Extended Analog JTAG controller 1416 can communicate voltage and/or current test signals to the Auxiliary Analog Circuitry 1304 of Tap domains 1302 via the AX1 and AX2 terminals 1420 and 1422. The analog voltage and/or current test signals can be used to test analog circuitry internal to the IC/core or external of the IC/core. Examples of such analog testing are described in detail in IEEE standard 1149.4.

Figure 15:
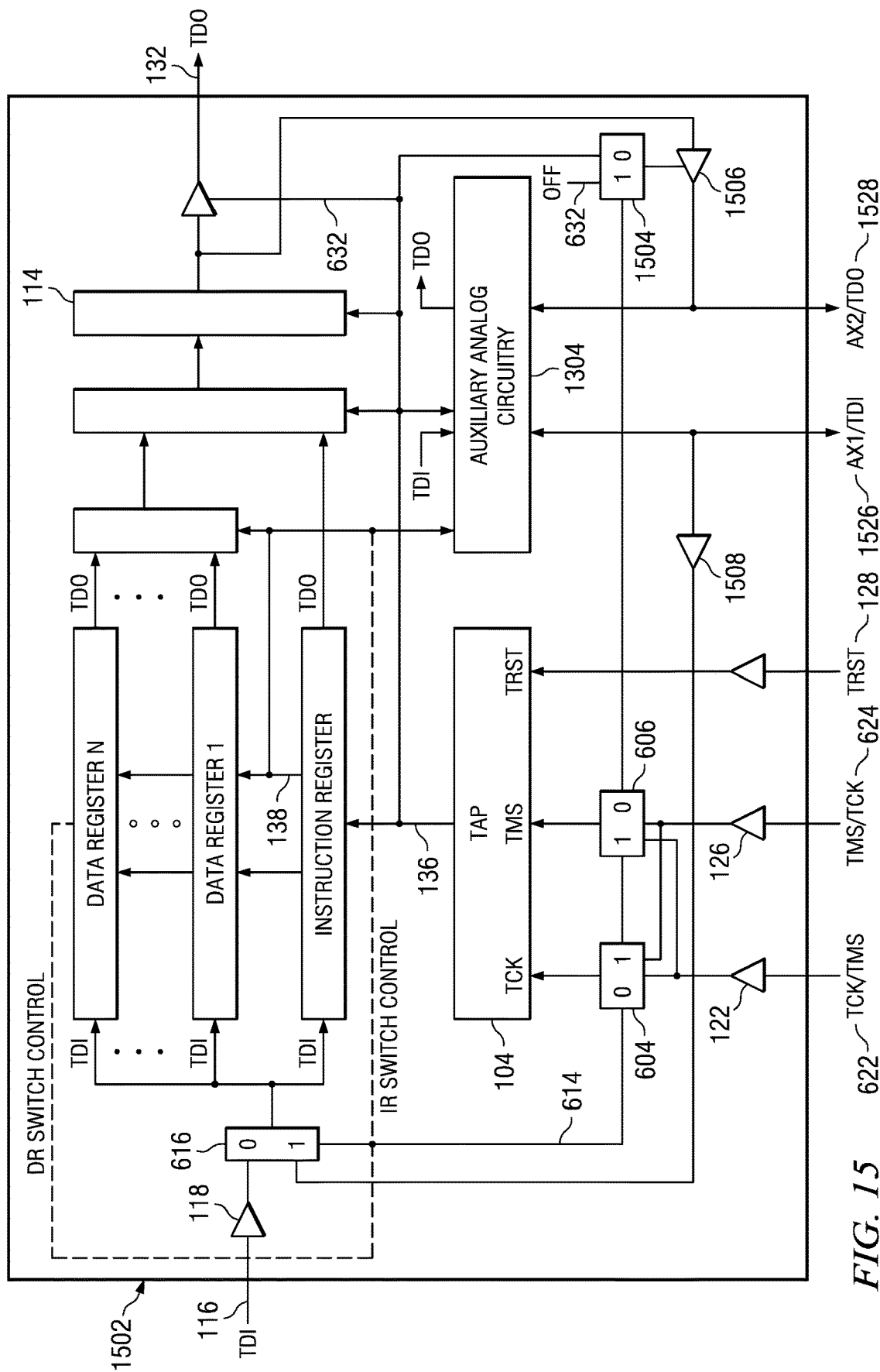
FIG. 15 depicts the Tap domain of FIG. 13 adapted according to the present disclosure.

FIG. 15 depicts an example of an IEEE 1149.1 Tap domain 1502 of the present embodiment. Tap domain 1502 is like the Tap domain 1302 of FIG. 13 with the following differences.

The TCK 120, TMS 124, AX1 1306, and AX2 1308 terminals of FIG. 15 have been renamed to TCK/TMS 622, TMS/TCK 624, AX1/TDI 1526, and AX2/TDO 1528, respectively, to indicate the dual use of the terminals.

A two input multiplexer 604 has been inserted into the TCK/TMS 622 input path to the Tap controller 104 and coupled to buffer 122, buffer 126, Switch control signal 614, and the TCK input of Tap controller 104 as described in FIG. 6.

A two input multiplexer 606 has been inserted into the TMS/TMS 624 input path to the Tap controller 104 and coupled to buffer 122, buffer 126, Switch control signal 614, and the TCK input of Tap controller 104 as described in FIG. 6.

A two input multiplexer 1504 and 3-state buffer 1506 have been added. One input of multiplexer 1504 is coupled to the previously described TDO output enable signal 632, the other input is coupled to the previously described OFF signal 630, and the output of the multiplexer is coupled to the 3-state input of buffer 1506. The OFF signal is set to a state that disables the output of buffer 1506. The control input to the multiplexer is connected to the previously described switch control signal 614. The input of buffer 1506 is coupled to the output of TDO output register 114, and the output of the buffer is coupled to AX2/TDO terminal 1528.

A two input multiplexer 616 has been inserted into the TDI input path 116 and a buffer 1508 has been added. The input of buffer 1508 is coupled to the AX1/TDI terminal 1526 and the output of the buffer is coupled to an input of multiplexer 616. The other input of multiplexer 616 is coupled to the output of TDI buffer 118, and the output of the multiplexer is coupled to the TDI inputs of the instruction register 106 and data registers 108. The control input to the multiplexer is connected to the previously described switch control signal 614.

In the Tap domain 1502 example of FIG. 15 it is seen that when the switch control signal 614 is set low, multiplexer 604 couples the TCK/TMS terminal 622 to the TCK input of Tap controller 104, multiplexer 606 couples the TMS/TCK terminal 624 to the TMS input of Tap controller 104, multiplexer 1504 couples the OFF signal to the 3-state control input of AX2/TDO buffer 1506, and multiplexer 616 couples the output of the TDI input buffer 118 to the TDI inputs of the data registers 108 and instruction register 106. In this configuration, the Tap domain 1502 operates the same as the Tap domain 1302 of FIG. 13.

When the switch control signal 614 is set high, multiplexer 604 couples the TMS/TCK signal 624 to the TCK input of Tap controller 104, multiplexer 606 couples the TCK/TMS signal 622 to the TMS input of Tap controller 104, multiplexer 1504 couples the TDO output enable signal 632 to the 3-state input of AX2/TDO buffer 1506, and multiplexer 616 couples the output of AX1/TDI buffer 1508 to the TDI inputs of the data registers 108 and instruction register 106. In this configuration, the Tap domain 1502 departs from the operation mode of Tap domain 1302 of FIG. 13 and enters the direct scan access operation mode of the present embodiment.

Figure 16A:
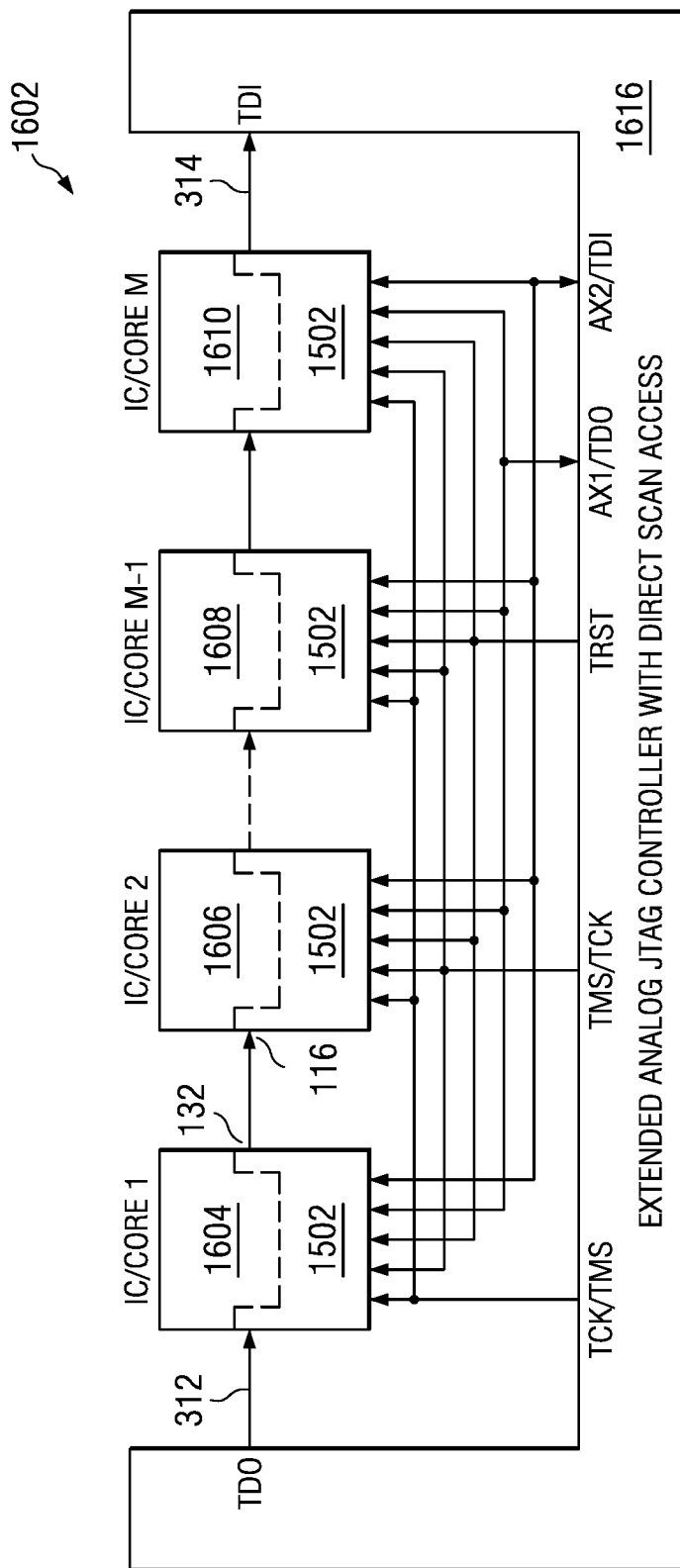
FIG. 16A depicts a JTAG controller coupled to a scan path of ICs/cores each including the Tap domain of FIG. 15 according to the present disclosure.

FIG. 16A depicts an example scan path 1602 where a number of Tap domain 1502 interfaces of ICs/Cores 1604-1610 are connected together serially, via their TDI 116 and TDO 132 terminals. The TDO input 312 and TDO output 314 of the scan path 1602, along with the TCK/TMS 622, TMS/TCK 624, TRST 128, AX1/TDI 1526, and AX2/TDO 1528 terminals of each Tap Domain 1502, are connected to an Extended Analog JTAG Controller with Direct Scan Access 1616. The JTAG Controller 1616 can serve as a test, debug, trace, emulation, in-system-programming, analog testing, and/or other application controller. The JTAG controller 1616 can access these applications using the conventional JTAG daisy-chain approach or the direct scan access approach of the present embodiment.

Figure 16B:
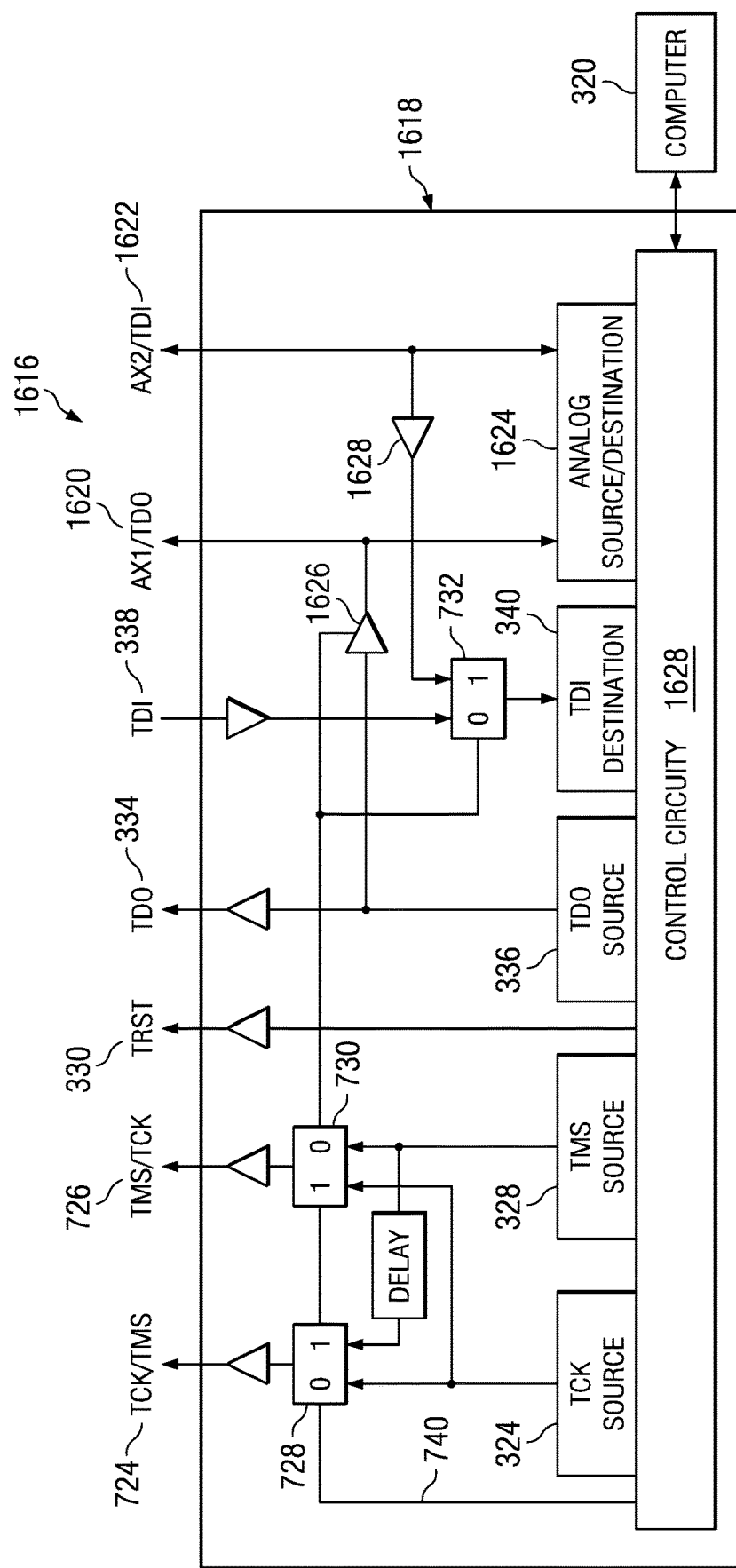
FIG. 16B depicts the JTAG controller of FIG. 16A in more detail according to the present disclosure.

FIG. 16B depicts an example of an Extended Analog JTAG Controller with Direct Scan Access 1616. The JTAG Controller 1616 consists of a Tap interface circuit 1618 and a computer 320 for controlling the Tap interface circuit. The Tap interface circuit 1618 is the like the Tap interface circuit 1418 of FIG. 14B with the following differences.

The TCK 322, TMS 326, AX1 1420, and AX2 1422 terminals of the controller of FIG. 14B have been renamed to TCK/TMS 724, TMS/TCK 726, AX1/TDO 1620, and AX2/TDI 1622, respectively, to indicate the dual use of the terminals. The TCK/TMS terminal 724 couples to the TCK/TMS terminals 622 of Tap domains 1502. The TMS/TCK terminal 726 couples to the TMS/TCK terminals 624 of Tap domains 1502. The AX1/TDO terminal 1620 couples to the AX1/TDI terminals 1526 of Tap domains 1502. The AX2/TDI 1622 terminal couples to the AX2/TDO terminals 1528 Tap domains 1502. The TDO 334, TDI 338, and TRST 330 terminals are coupled to Tap Domain 1502 terminals TDI 116, TDO 132, and TRST 128 respectively.

A two input multiplexer 728 has been inserted into the TCK/TMS 724 output path as described in FIG. 7B.

A two input multiplexer 730 has been inserted into the TMS/TCK 726 output path as described in FIG. 7B A two input multiplexer 732 has been inserted into the TDI 338 input path as described in FIG. 7B.

A buffer 1628 has been added. The input of the buffer is coupled to the AX2/TDI terminal 1622 and the output of the buffer is coupled to an input of multiplexer 732.

A 3-state buffer 1626 has been added. The input of the buffer is coupled to the output of TDO source 336, the output of the buffer is coupled to the AX1/TDI terminal 1620, and the 3-state control input of the buffer is coupled to the previously described control signal 740.

Control Circuitry 1624 provides, in addition to the functionality of Control Circuitry 1432, the control signal 740 for regulating the settings of multiplexers 728-732 and buffer 1626, in response to input from computer 320.

In the Tap interface circuit 1618 example of FIG. 16, when the control signal 740 is set low the multiplexers 728-732 are controlled such that the TCK source 324 is coupled to the TCK/TMS terminal 724, the TMS source 328 is coupled to the TMS/TCK terminal 726, the TDI Destination 340 is coupled to the TDI terminal 338, and the Analog Source/Destination 1624 is the only source for AX1/TDO terminal 1620. In this mode, the Tap Interface Circuit 1618 operates the same as the Tap Interface Circuit 1418 of FIG. 14B to access the Tap domains in a daisy-chain fashion and perform analog test operations.

When the control signal 740 is set high the multiplexers 728-732 are controlled such that the TMS source 328 is coupled to the TCK/TMS terminal 724, the TCK source 324 is coupled to the TMS/TCK terminal 726, the TDI Destination 340 is coupled to the AX2/TDI terminal 1622, and the TDO source 336 is coupled to the AX1/TDO terminal 1620. In this mode, the Tap Interface Circuit 1618 operates to access the selected Tap domain 1502 using the direct scan access approach of the present embodiment. The selected Tap domain 1502 will be configured for direct scan access by its Switch Control signal 614 being set high. Non-selected Tap domains 1502 will remain in the daisy-chain TDI to TDO access mode by their Switch Control signal 614 being set low.

During direct scan access, the selected Tap domain 1502 will input serial data at its AX1/TDI terminal 1526 from the AX1/TDO terminal 1620 of JTAG controller 1616, and will output serial data from its AX2/TDO terminal 1528 to the AX2/TDI terminal 1622 of the JTAG controller 1616 during instruction and data scan operations. As described previously in regard to FIGS. 7A-7C, only the selected Tap domain will receive the correct TMS and TCK inputs for performing instruction and data scans. Non-selected Tap domains will receive input on TMS and TCK but the input will not affect the state of the non-selected Tap domains.

By substituting IC/cores 1604-1610 for IC/cores 704-710 and the JTAG controller 1616 for JTAG controller 716 in FIGS. 8 and 9A-9B, use of the present embodiment to perform direct scan access operations using auxiliary analog terminals can be seen. Also, the transition between daisy-chain access mode and direct scan access modes is the same as was described previously in regard to in FIGS. 10-12.

Figure 17:
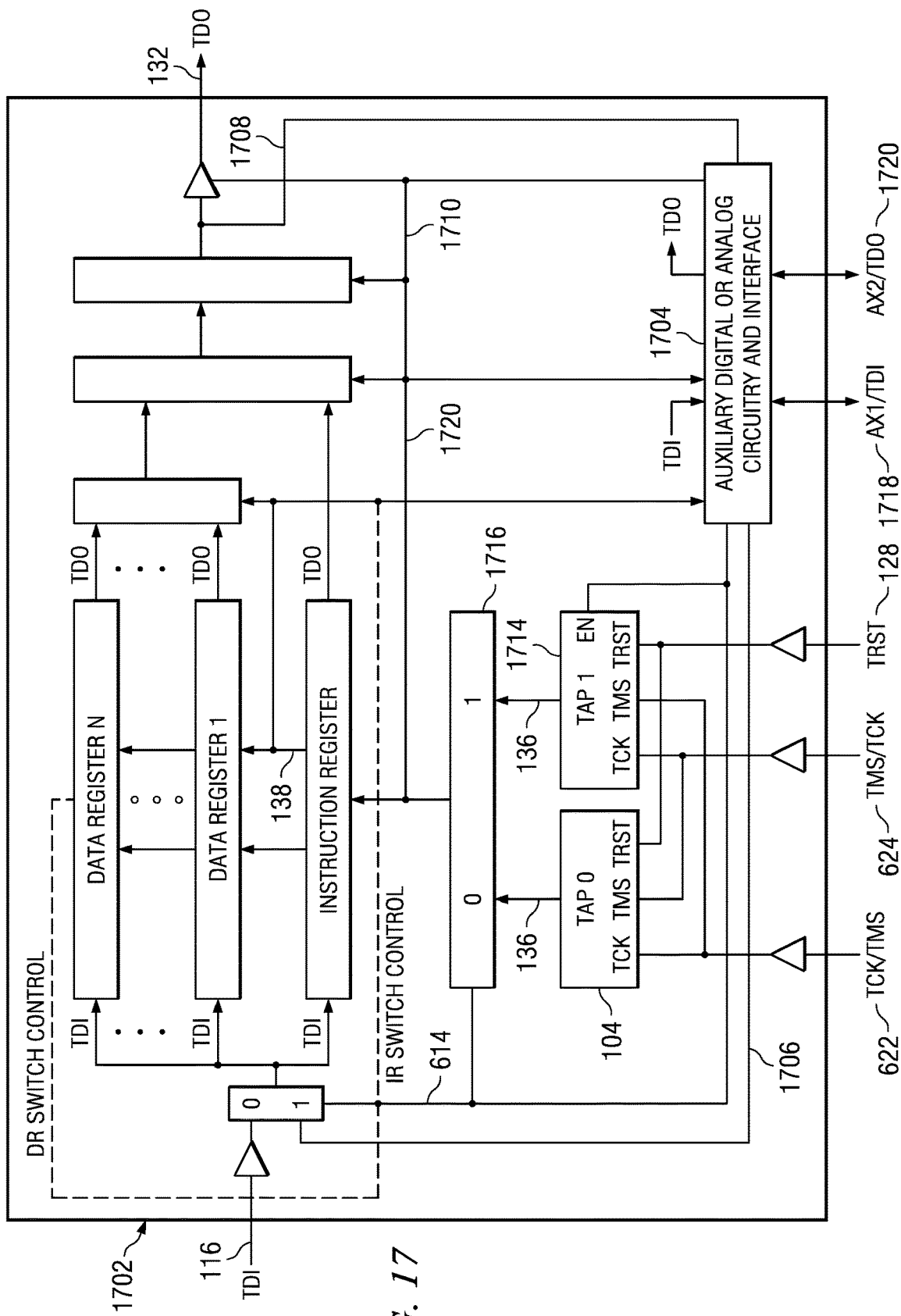
FIG. 17 depicts a first alternate method of adapting the Tap domains of FIGS. 4 and 13 according to the present disclosure.

FIG. 17 depicts a first alternate Tap domain 1702 implementation of the present embodiment. The Auxiliary Digital or Analog Circuitry and Interface block 1704 of FIG. 17 represents either the Auxiliary Digital Circuit block 404 and interface of FIG. 6 or the Auxiliary Analog Circuit block 1304 and interface of FIG. 15. Connections 614, 1706, 1708, and 1710 to block 1704 represent the connections to the Auxiliary Digital or Analog Circuits blocks and interfaces of FIGS. 6 and 15. AX1/TDI 1718 represents either AX1/TDI 626 of FIG. 6 or AX1/TDI 1526 of FIG. 15. AX2/TDO 1720 represents either AX2/TDO 628 of FIG. 6 or AX2/TDO 1528 of FIG. 15. The Tap domain 1702 is like the Tap domains 602 of FIGS. 6 and 1502 of FIG. 15 with the following difference.

Instead of using a single Tap controller 104 and multiplexers 604 and 606, the implementation of FIG. 17 uses two Tap controllers 104 and 1714 and one multiplexer 1716. Tap controller 1714 is different from Tap controller 104 in that it has an enable (EN) input. The TCK and TMS inputs of Tap controller 104 are coupled to TCK/TMS 622 and TMS/TCK 624 terminals respectively, and the TCK and TMS inputs of Tap controller 1714 are coupled to the TMS/TCK 624 and TCK/TMS 622 terminals respectively. The TRST input of both Tap controllers are coupled to the TRST terminal 128. The enable input of Tap controller 1714 is coupled to the switch control signal 614. The multiplexer 1716 has a first bus input coupled to receive the control bus output 136 from Tap controller 104, a second bus coupled to receive the control bus output 136 from Tap controller 1714, an output bus 1720 for outputting a selected one of the Tap control buses 136, and a control input coupled to switch control signal 614.

Figure 18:
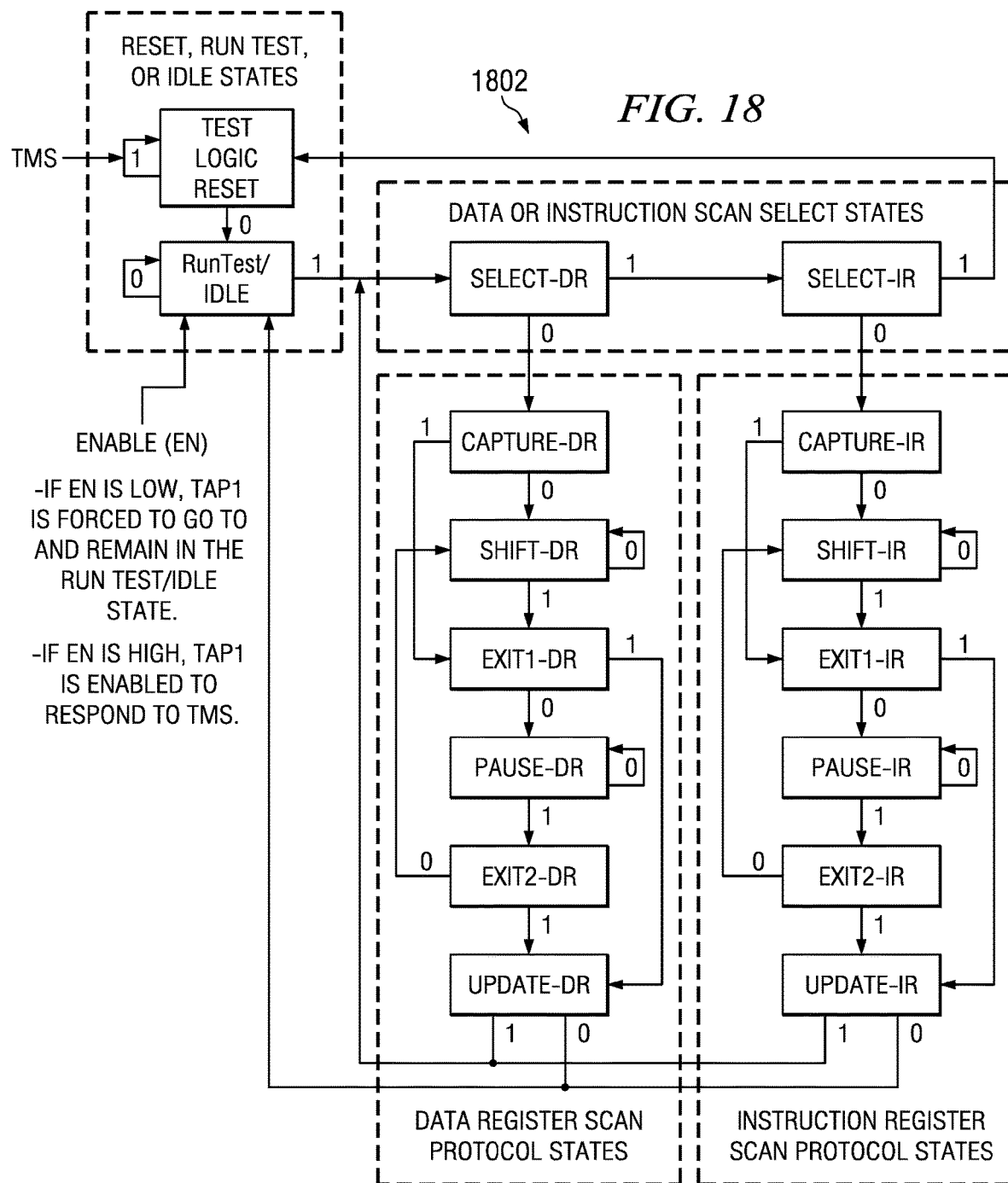
FIG. 18 depicts the state diagram of one of the Tap controllers in the Tap domain of FIG. 17 according to the present disclosure.

At power up or following a test reset, the switch control signal 614 will go low as it does for the Tap domains 602 and 1502. While switch control 614 is low, multiplexer 1714 selects the control output bus 136 of Tap controller 104 to be coupled to bus 1720. While switch control signal 614 is low, the enable input of Tap controller 1714 is low forcing Tap controller 1714 to be disabled in the Run Test/idle state of its state diagram 1802, as shown in FIG. 18. In this mode, the Tap domain 1702 can operate, via Tap controller 104, in the TDI to TDO daisy-chain scan path arrangement of FIG. 8 with the JTAG controller 716 set for daisy-chain scan access (i.e. JTAG controller control signal 740 set low).

When switch control signal 614 is set high, via a data or instruction scan, Tap controller 1714 is enabled, via its enable input being high, and its control output bus 136 is coupled to bus 1720 via multiplexer 1716. As seen in FIG. 18, Tap controller 1714 is enabled in the Run Test/Idle state which is the correct state for taking over control of bus 1720 from Tap controller 104 and operating the Tap domain 1702 in the direct scan access mode (see FIGS. 10, 11, and 12). In this mode, the Tap domain 1702 can operate in the direct scan access arrangements of FIGS. 9A-9D with the JTAG controller 716 set for direct scan access (i.e. JTAG controller control signal 740 set high). While the JTAG controller is set for direct scan access, Tap controller 104 will receive the previously described incorrect TCK and TMS protocol which causes it to remain in the Run Test/Idle state. The daisy-chain scan access mode may be re-entered by performing a data or instruction scan and setting the switch control signal 614 low, as described in regard to FIGS. 10-12.

Figure 19:
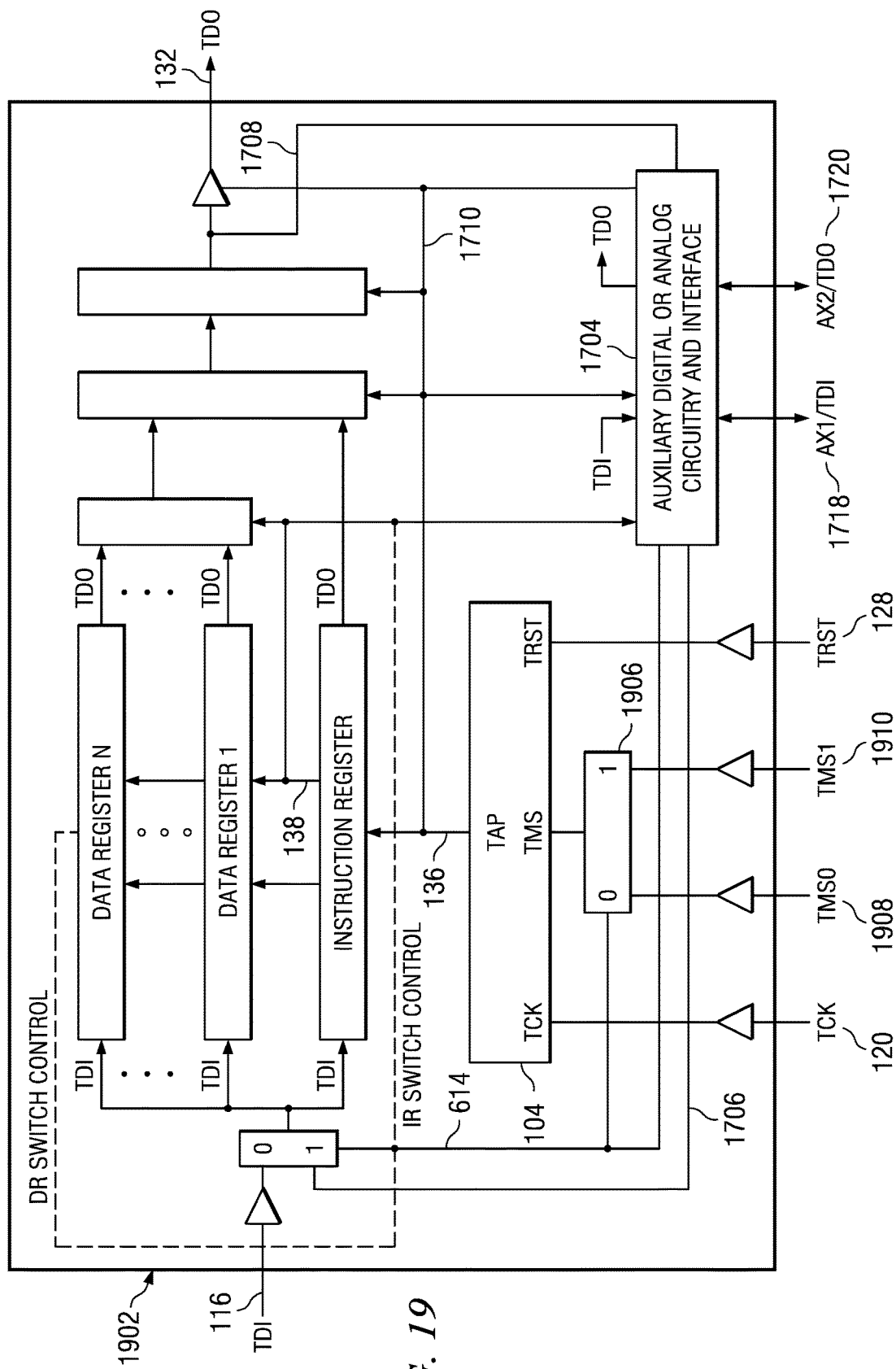
FIG. 19 depicts a second alternate method of adapting the Tap domains of FIGS. 4 and 13 according to the present disclosure.

FIG. 19 depicts a second alternate Tap domain 1902 implementation of the present embodiment. The Tap domain 1902 is like the Tap domain 1702 with the following difference.

Instead of using two Tap controllers 104 and 1714 and multiplexer 1716, the implementation of FIG. 19 uses one Tap controller 104, one multiplexer 1906, and two TMS input terminals (TMS1, TMS2) 1908 and 1910. One input of multiplexer 1906 is coupled to TMS0 terminal 1908, the other input is coupled to TMS1 terminal 1910, and the multiplexer output is coupled to the TMS input of Tap controller 104. The control input of multiplexer 1906 is coupled to switch control signal 614. The TMS0 terminal 1908 is the normal JTAG TMS terminal used to perform scan access operations via TDI 116 and TDO 132 (as does TMS terminal 124 of FIG. 1) and the TMS1 terminal 1910 is an additional TMS terminal used to perform direct scan access operations via AX1/TDI 1718 and AX2/TDO 1720.

At power up or following a test reset, the switch control signal 614 will go low as it does for the Tap domains 602, 1502, and 1702. While switch control 614 is low, multiplexer 1906 selects TMS0 1908 to be coupled to the TMS input of Tap controller 104. In this mode, the Tap domain 1902 can operate in response to input from TMS0 terminal 1908 to perform daisy-chain instruction and data scan operations from TDI 116 to TDO 132 as per FIG. 5A.

When switch control signal 614 is set high, via a data or instruction scan, multiplexer 1906 couples the TMS1 terminal 1910 to the TMS input of Tap controller 104. In this mode, the Tap domain 1902 can operate in response to input from TMS1 terminal 1910 to perform direct scan access instruction and data scan operations from AX1/TDI 1718 to AX2/TDO 1720.

Figure 20A:
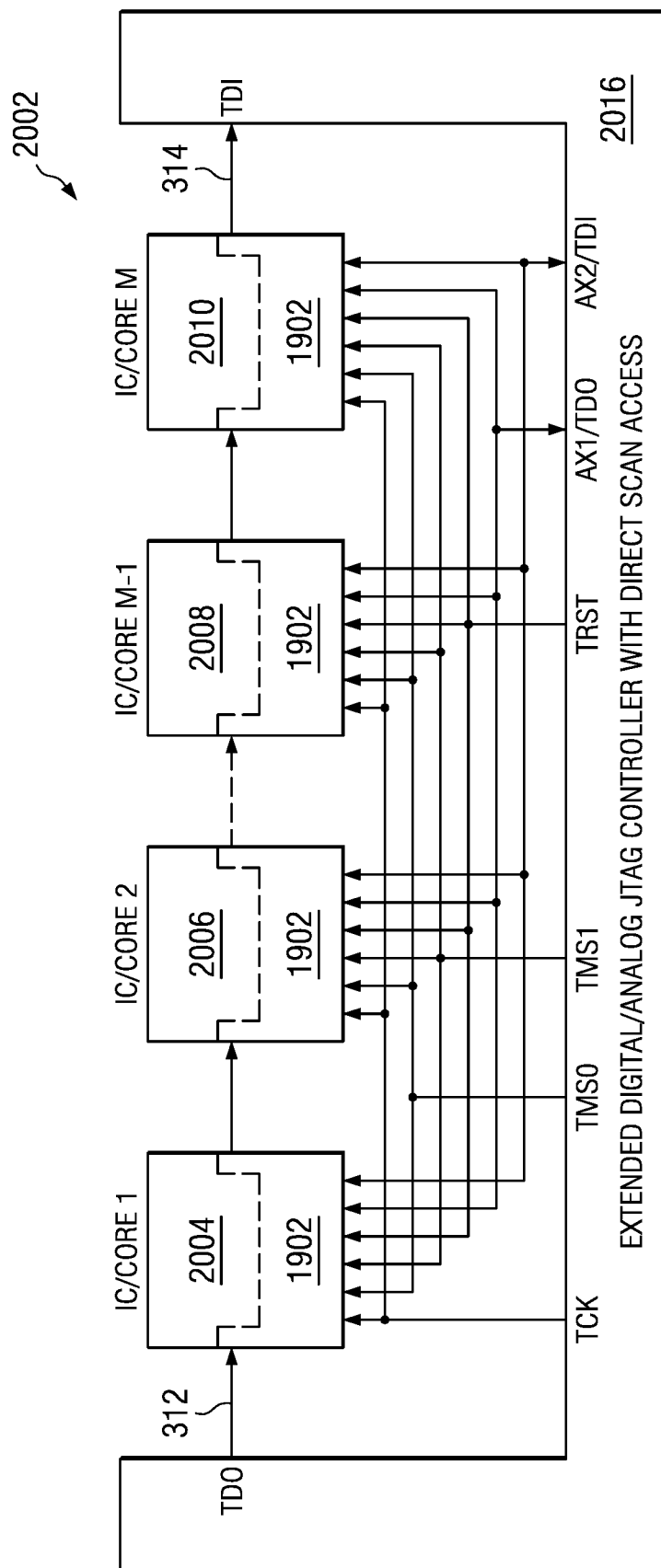
FIG. 20A depicts a JTAG controller coupled to a scan path of ICs/cores each including the Tap domain of FIG. 19 according to the present disclosure.

FIG. 20A depicts a scan path 2002 of IC/cores 2004-2010, each having a Tap domain 1902. The scan path 2002 is coupled to an Extended Digital/Analog JTAG Controller with Direct Scan Access 2016.

Figure 20B:
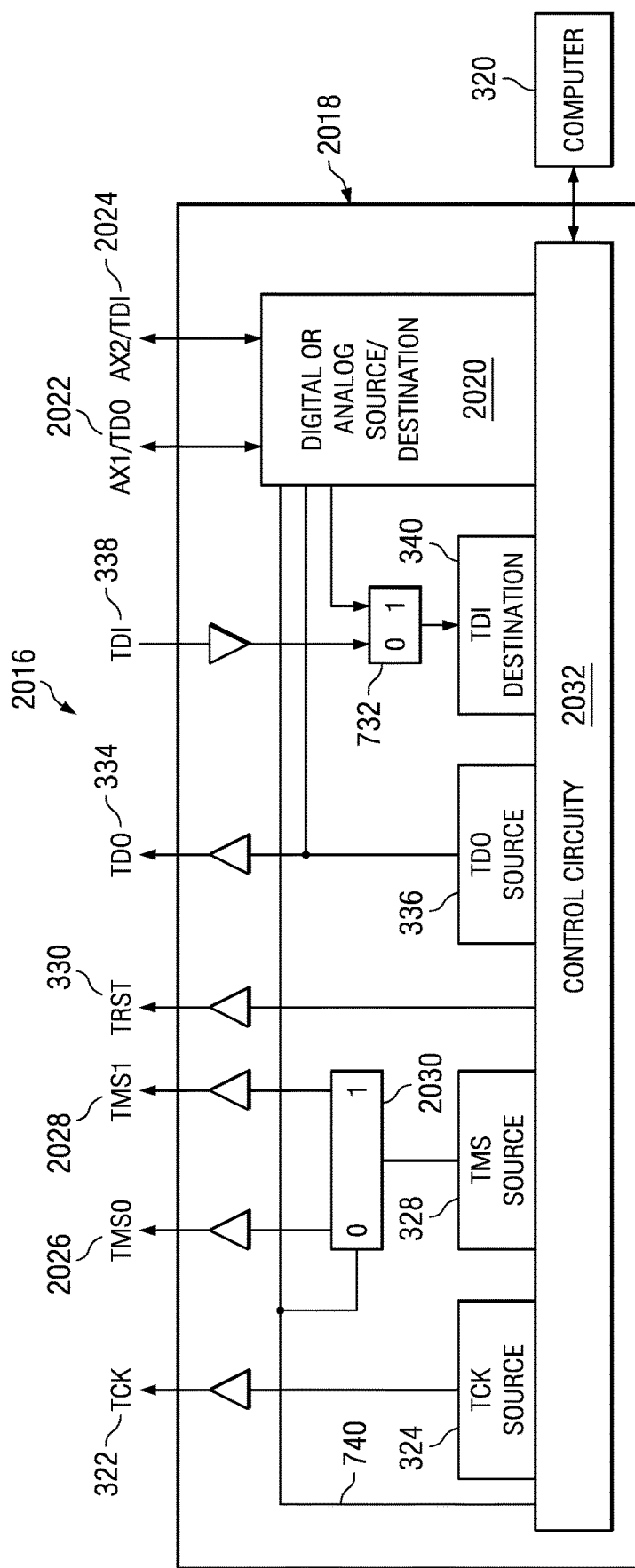
FIG. 20B depicts the JTAG controller of FIG. 20A in more detail according to the present disclosure.

In FIG. 20B the JTAG controller 2016 is seen to include a Tap interface circuit 2018, and a computer 320. The JTAG controller's TCK 322, TMS0 2026, TMS1 2028, TRST 330, TDO 334, TDI 338, AX1/TDO 2022, and AX2/TDI 2024 terminals are connected to the 1902 Tap domain's TCK 120, TMS0 1908, TMS1 1910, TRST 128, TDI 116, TDO 132, AX1/TDI 1718, and AX2/TDO 1720 terminals, respectively. A Digital or Analog Source/Destination block 2020 is shown in Tap interface circuit 2018 to indicate use of either the Auxiliary Digital Circuit block and interface of FIG. 7B or the Auxiliary Analog Circuit block and interface of FIG. 16B. Also control circuit 2032 could be either control circuit 738 of FIG. 7B or control circuit 1628 of FIG. 16B. Circuit block 2020 is coupled to the control signal 740, multiplexer 732, and TDO Source 336, as shown in FIGS. 7B and 16B. The Tap interface circuit 2018 includes a demultiplexer 2030. The input of the demultiplexer is coupled to the TMS source 328, one output is coupled to TMS0 2026, the other output is coupled to TMS1 2028, and the control input is coupled to control signal 740.

If the Tap domains 1902 of scan path 2002 are set for daisy-chain scan access via TDI 312 and TDO 314 (their switch control signal 614 is low) the control signal 740 of the Tap interface circuit 2018 will be low to allow TMS source 328 to drive the Tap domain TMS0 terminals 1908 (via demultiplexer 2030 and TMS0 terminal 2026) while the scan path TDI terminal 312 inputs from TDO terminal 334 and the scan path TDO terminal 314 outputs to the TDI terminal 338.

If a Tap domain 1902 of scan path 2002 is set for direct scan access via AX1/TDI 1718 and AX2/TDO 1720 (its switch control signal 614 is high) the control signal 740 of the Tap interface circuit 2018 will be high to allow TMS source 328 to drive the Tap domain's TMS1 terminal 1910 (via demultiplexer 2030 and TMS1 terminal 2028) while the Tap domain's AX1/TDI terminal 1718 inputs from AX1/TDO terminal 2022 and the Tap domain's AX2/TDO terminal 1720 outputs to the AX2/TDI terminal 2024.

So as seen in FIGS. 19, 20A, and 20B, the TMS0 terminals of the Tap domains 1902 and JTAG controller 2016 are used during daisy-chain scan access operations of the Tap domains in scan path 2002 whereas the TMS1 terminals of the Tap domains 1902 and JTAG controller 2016 are used during direct scan access operations to a selected Tap domain in scan path 2002.

Figure 21:
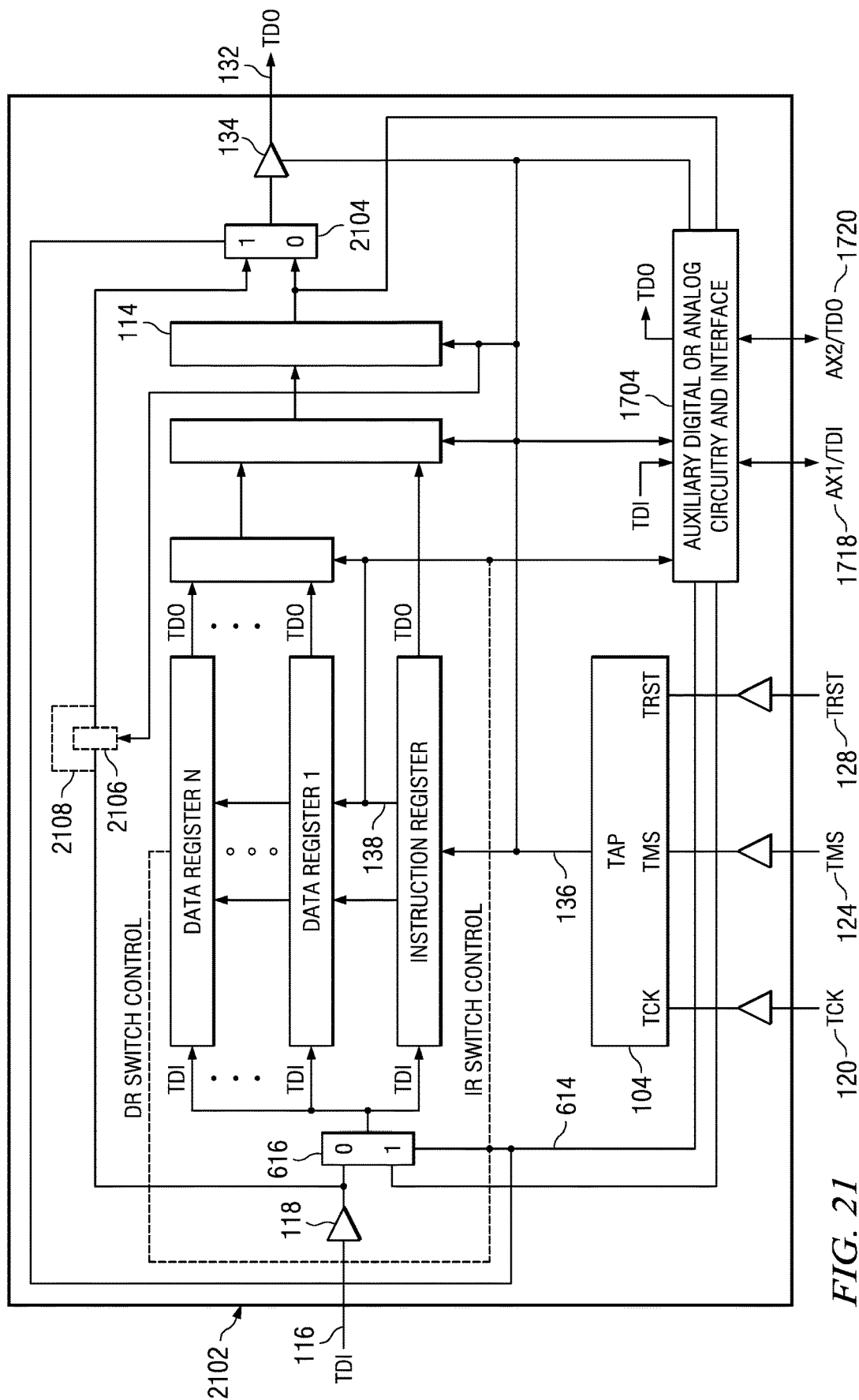
FIG. 21 depicts a third alternate method of adapting the Tap domains of FIGS. 4 and 13 according to the present disclosure.

FIG. 21 depicts a third alternate Tap domain 2102 implementation of the present embodiment. The Tap domain 2102 is like the Tap domains 1702 and 1902 with the following differences.

(1) Instead of using two Tap controllers 104 and 1714 and multiplexer 1716 as in FIG. 17 or a single Tap controller 104 and TMS multiplexer 1906 as in FIG. 19, the implementation of FIG. 19 uses one Tap controller 104 with direct connections to terminals TCK 120, TMS 124, and TRST 128.

(2) A two input multiplexer 2104 has been inserted in the TDO 132 output path. One input of the multiplexer is coupled to the output of TDI buffer 118, the other input is coupled to the output of TDO register 118, the output of the multiplexer is coupled to the input of TDO buffer 134, and the control input is coupled to switch control signal 614. The coupling between the output of TDI buffer 118 and the input of multiplexer 2104 can be either a direct connection as indicated by dotted line 2108 or it can be coupled through a storage element such as dotted line DFF register 2108. If coupled using register 2108, the register will be connected to the output control bus 136 of Tap controller 104 in such a way as to allow the register to shift data from TDI 116 to TDO 132 during both instruction and data scan operations. As can be seen, while switch control signal 614 is high (i.e. direct scan access mode), and during instruction and data scan operations the register 2106 or connection 2108 provides a bypass path around the Tap domain's instruction 106 and data 108 registers from TDI 116 to TDO 132.

At power up or following a test reset, the switch control signal 614 will go low as it does for the Tap domains 602, 1502, 1702, and 1902. While switch control 614 is low, Auxiliary Digital or Analog Circuit block 1704 is enabled to perform its designated digital I/O (such as IEEE 5001) or analog I/O (such as IEEE 1149.4) functions. Also while switch control signal 614 is low, multiplexer 2104 couples the output of TDO register 114 to the TDO output terminal 132 to allow Tap controller 104 to perform instruction and data scan operations from TDI 116 to TDO 132.

When switch control signal 614 is set high, via a data or instruction scan, the designated function of the Auxiliary Digital or Analog Circuit block 1704 is disabled to allow the Tap controller 104 to perform direct access instruction or data scan operations using the Auxiliary circuit block's AX1/TDI 1718 and AX2/TDO 1720 terminals. While switch control signal 614 is high, multiplexer 2104 is set to pass data from TDI 116 to TDO 132, via either the direct connection 2108 or register 2106, during direct scan access instruction and data scan operations. So, during direct access instruction or data scan operations, Tap domain 2102 shifts data simultaneously through two separate paths, one path from TDI 116 to TDO 132 and the other path from AX1/TDI 1718 to AX2/TDO 1720.

Figure 22A:
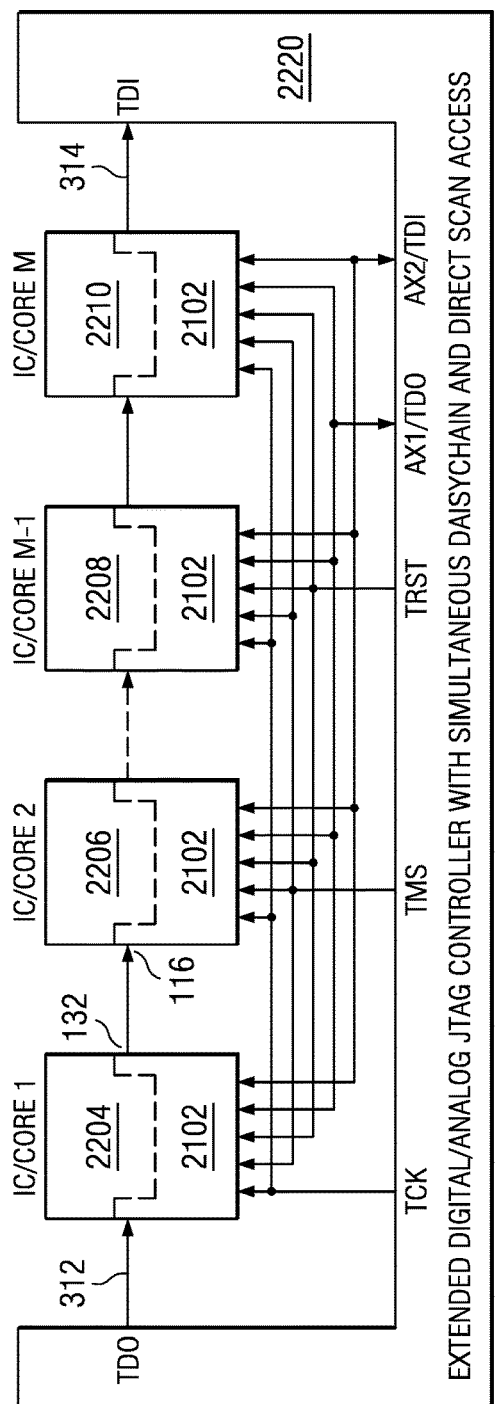
FIG. 22A depicts a JTAG controller coupled to a scan path of ICs/cores each including the Tap domain of FIG. 21 according to the present disclosure.

FIG. 22A depicts a scan path 2202 of IC/cores 2204-2210, each having a Tap domain 2102. The scan path 2202 is coupled to an Extended Digital/Analog JTAG Controller with Simultaneous Daisy-Chain and Direct Scan Access 2220.

Figure 22B:
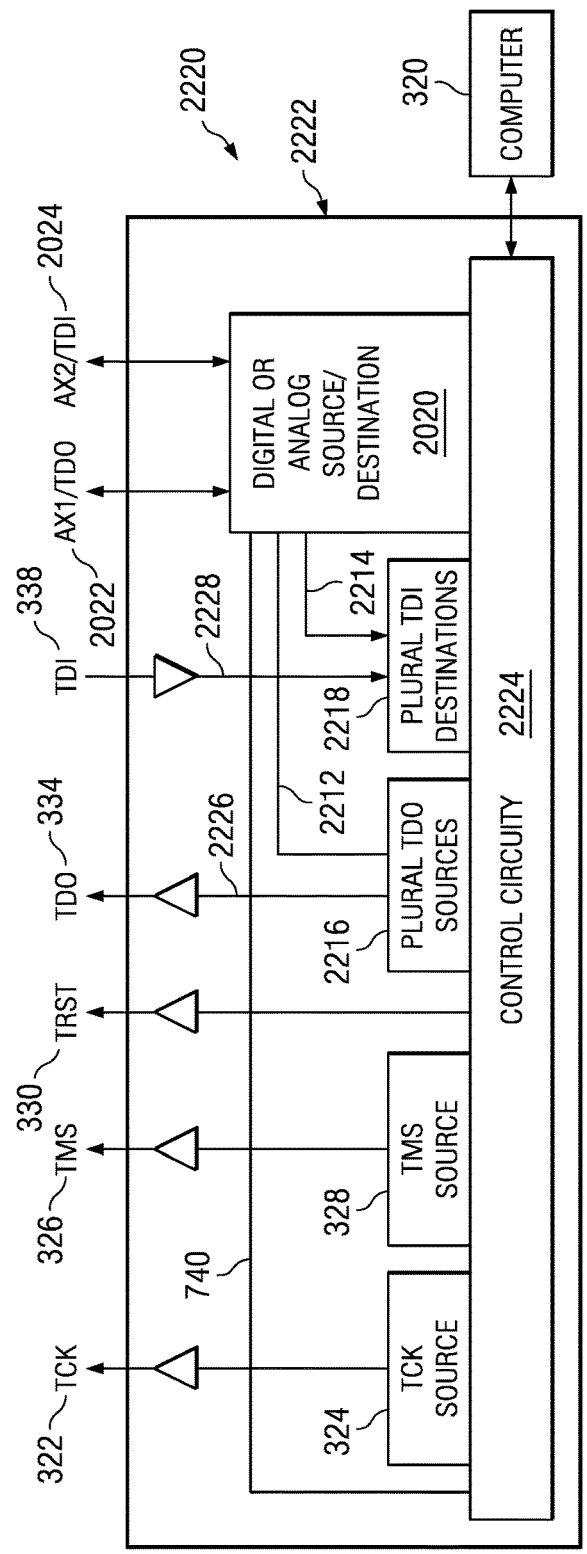
FIG. 22B depicts the JTAG controller of FIG. 22A in more detail according to the present disclosure.

In FIG. 22B the JTAG controller 2220 is seen to include a Tap interface circuit 2222, and a computer 320. The JTAG controller's TCK 322, TMS 326, TRST 330, TDO 334, TDI 338, AX1/TDO 2022, and AX2/TDI 2024 terminals are connected to the 2102 Tap domain's TCK 120, TMS 124, TRST 128, TDI 116, TDO 132, AX1/TDI 1718, and AX2/TDO 1720 terminals, respectively. As with Tap interface circuit 2018 of FIG. 20B, the Tap interface circuit 2222 includes a Digital or Analog Source/Destination and interface block 2020 to indicate use of either the Auxiliary Digital 524 or Analog 1624 Circuit blocks and interfaces of FIGS. 7B and 16B. The Tap interface circuit 2018 differs from previous Tap interface circuits in that it includes a plural TDO sources 2216 and a plural TDI destinations 2218.

The plural TDI sources 2216 and TDO destinations 2218 are coupled to control circuitry 2224 which has been adapted to allow computer 320 to control the sources and destinations 2216 and 2218. One TDO output 2226 of the plural TDO sources 2216 is coupled to the TDO terminal 338 and the other TDO output 2212 is coupled to the AX1/TDO terminal 2022 via circuit 2020. One TDI input 2228 of the plural TDI destinations 2218 is coupled to the TDI terminal 338 and the other TDI input 2214 is coupled to the AX2/TDI terminal 2024 via circuit 2020.

If the Tap domains 2102 of scan path 2202 in FIG. 22A are set for daisy-chain scan access via TDI 312 and TDO 314 (i.e. their switch control signal 614 is low), the control signal 740 of the Tap interface circuit 2222 in FIG. 22B will be set low to de-couple the TDO signal 2212 from the AX1/TDO 2022 terminal and the TDI signal 2214 from the AX2/TDI 2024 terminal, which enables circuit 2020 to perform digital I/O (such as IEEE 5001) or analog I/O (such as IEEE 1149.4) operations. During daisy-chain scan access, the TCK source 322 drives the TCK 120 terminals of Tap domains 2102, the TMS source 328 drives the TMS terminals of Tap domains 2102, the 2226 output of plural TDO sources 2216 inputs data to the TDI 312 input of scan path 2202, and 2228 input of the Plural TDI destinations 2218 inputs data from the TDI 314 output of scan path 2202. Also during daisy-chain scan access, output 2212 of the TDO sources 2216 and input 2214 of the TDI destinations 2218 are disabled by control circuitry 2224 since access to the AX1/TDI 2020 and AX2/TDI 2022 terminals of circuit block 2020 is not available.

Figure 23A:
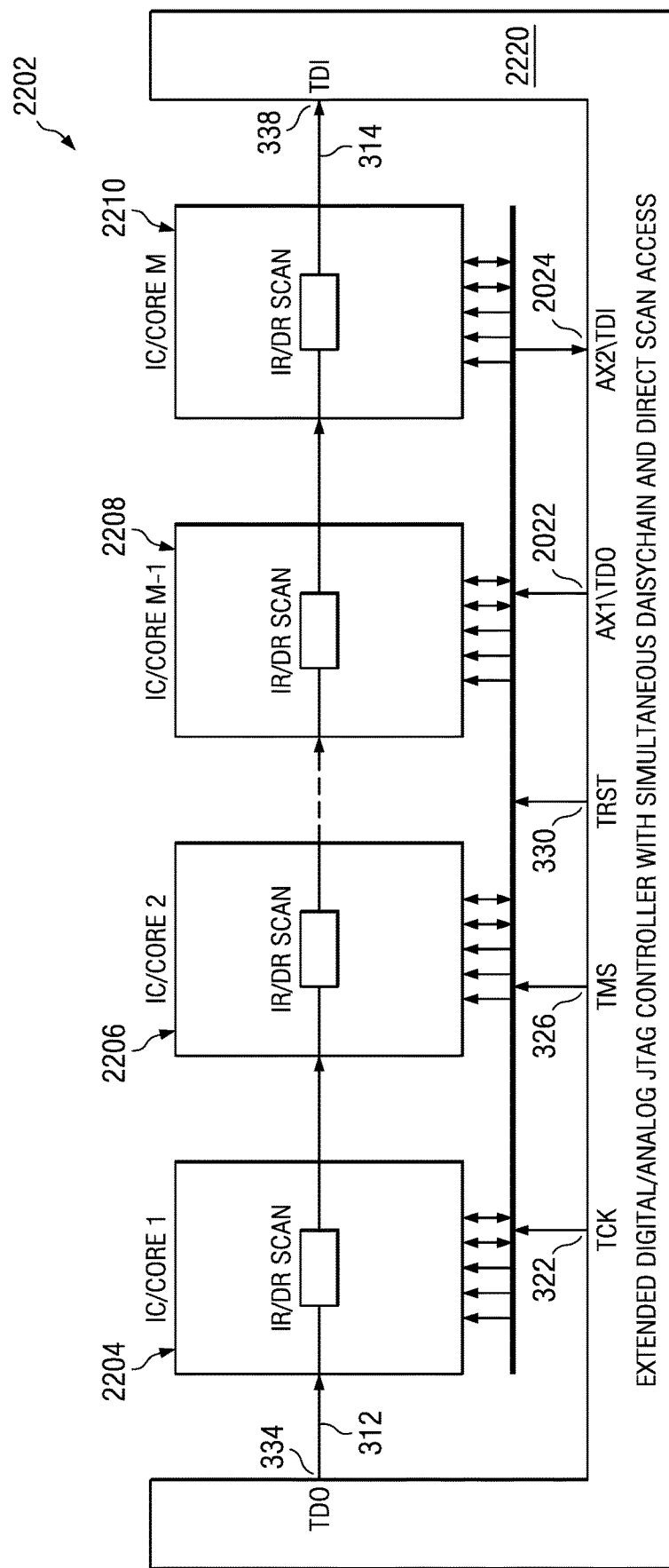
FIG. 23A depicts the FIG. 21 Tap domains being controlled by the JTAG controller of FIG. 22B to operate in a daisy-chain scan access mode according to the present disclosure.

FIG. 23A depicts JTAG instruction or data scan operations occurring on scan path 2202 while it is in the above mentioned daisy-chain scan access mode. As seen the AX1/TDO 2022 and AX2/TDI 2024 terminals are free to perform their designated digital or analog I/O operations.

In Figure If a Tap domain 2102 of scan path 2202 in FIG. 22A is set for direct scan access via AX1/TDI 1718 and AX2/TDO 1720 (i.e. its switch control signal 614 is high), the control signal 740 of the Tap interface circuit 2222 in FIG. 22B will be set high to couple the TDO signal 2212 to the AX1/TDO 2022 terminal and the TDI signal 2214 to the AX2/TDI 2024 terminal. While control signal 740 is high, the digital I/O (such as IEEE 5001) or analog I/O (such as IEEE 1149.4) operations of circuit 2020 are disabled and the circuit's AX1/TDI and AX2/TDI terminals can be used for direct scan access input and output to the selected Tap domain. During direct scan access, the TCK source 322 drives the TCK 120 terminals of Tap domains 2102, the TMS source 328 drives the TMS terminals of Tap domains 2102, the AX1/TDO 2022 terminal of circuit 2020 outputs data from TDO sources 2216 (via output 2212) to the AX1/TDI terminal 1718 of the selected Tap domain, and the AX2/TDI terminal 2024 of circuit 2020 inputs data to TDI sources 2218 (via input 2214) from the AX2/TDO terminal 1720 of the selected Tap domain.

Also during direct scan access, output 2226 of TDO sources 2216 outputs data (via TDO 334) to the TDI 312 input of scan path 2202 and input 2228 of TDI destinations 2218 inputs data (via TDI 338) from the TDO 314 output of scan path 2202. From this description it is seen that during direct scan access operations the JTAG controller 2220 simultaneously scans data through the scan path 2202 from TDO 334 to TDI 338 and through the selected Tap domain from AX1/TDO 2022 to AX2/TDI 2024.

Figure 23B:
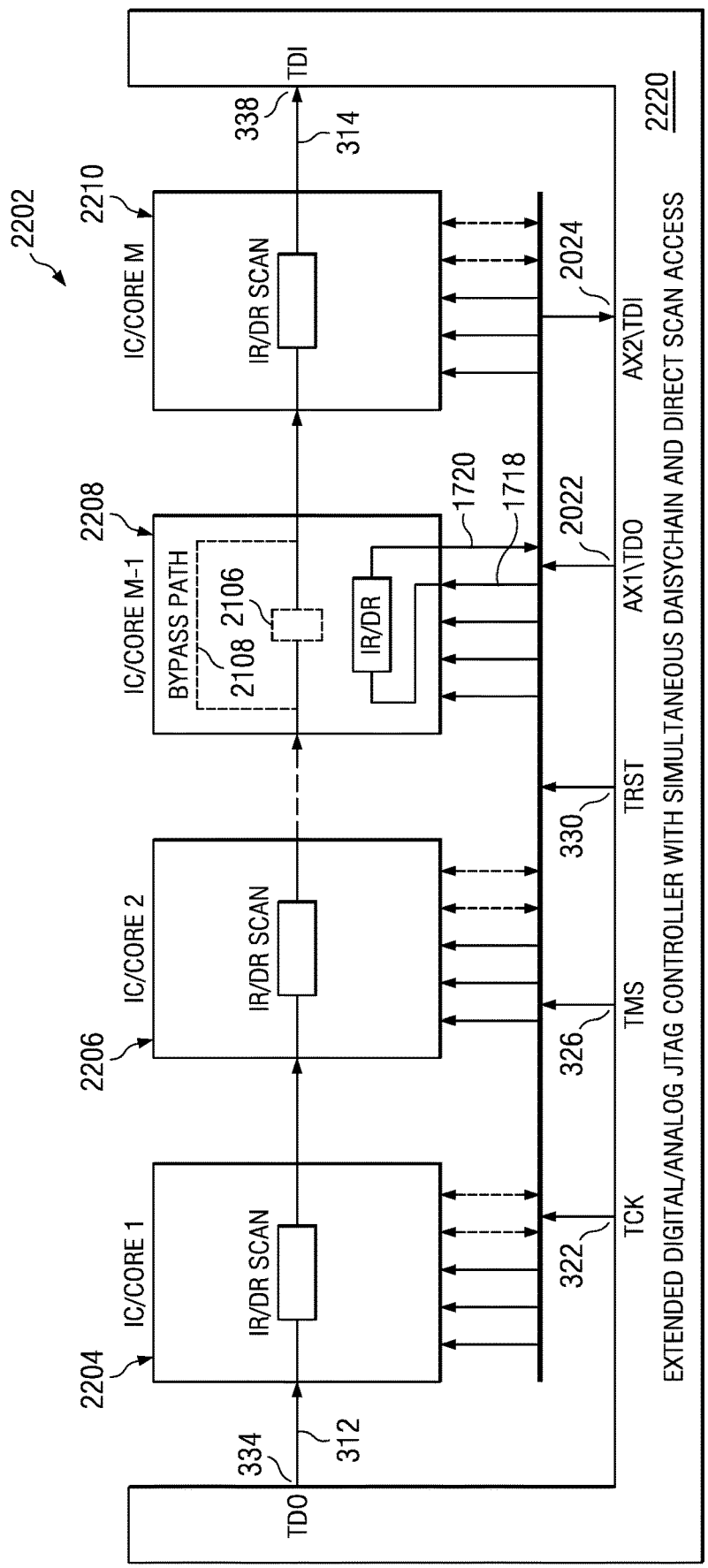
FIG. 23B depicts the FIG. 21 Tap domains being controlled by the JTAG controller of FIG. 22B to operate in a simultaneous daisy-chain and direct scan access mode according to the present disclosure.

FIG. 23B depicts daisy-chained JTAG instruction or data scan operations occurring in the Tap domains 2102 of IC/cores 2204-2210 from TDI 312 to TDO 314 of scan path 2202, while Tap domain 2102 of IC/core 2208 is in the direct scan access mode and simultaneously performing instruction or data scan operations from its AX1/TDI 1718 and AX2/TDO 1720 terminals. In IC/core 2208, the TDI to TDO bypass path, formed using either a direct connection 2108 or register bit 2106 as described in FIG. 21, provides the serial link between the daisy-chained Tap domains of IC/cores 2204, 2206, and 2210. As seen in FIG. 23B, the AX1/TDO 1718 and AX2/TDI 1720 terminals of IC/cores 2204, 2206, and 2210 are disabled (dotted line) to allow the JTAG controller 2220 to serially input to and output from the AX1/TDI 1718 and AX2/TDO 1720 terminals of the selected Tap domain of IC/core 2208.

During JTAG instructions scan operations to the Tap domains in the scan path 2202 of FIG. 23B, the instruction registers 106 of the daisy-chained IC/cores 2204, 2206, and 2210 are loaded from the JTAG controller 2220 using the TDI 312 and TDO 314 scan path terminals, and the instruction register 106 of the directly accessed IC/core 2208 is loaded from the JTAG controller 2220 using the IC/core 2208 AX1/TDI 1718 and AX2/TDO 1720 terminals. The length of the instruction scan operation performed by the JTAG controller 2220 is set by the longer of the daisy-chained instruction registers in IC/core 2204, 2206, and 2210 or the directly accessed instruction register in IC/core 2208.

For example, if the length of the daisy-chained instruction registers is 500 bits (including register bit 2106 of IC/core 2208 if implemented) and the length of the directly accessed instruction register of IC/core 2208 is 10 bits, the JTAG controller will perform an instruction register scan operation of 500 bits. During the instruction register scan operation, the JTAG controller will input the 500 bit instruction scan pattern to the daisy-chained instruction registers of IC/cores 2204, 2206, and 2210 via TDI 312 and TDO 314, and a 500 bit instruction scan pattern to the directly accessed instruction register of IC/core 2208. The 10-bit instruction for the directly accessed IC/core 2208 will be positioned at the end of the 500 bit instruction scan pattern shifted into the instruction register of IC/core 2208 so that it loads correctly into the 10-bit instruction register.

The daisy-chained Tap domains 2102 of IC/cores 2204, 2206, and 2210 will be loaded with a JTAG Bypass, Clamp, or HighZ instruction to allow the single bit JTAG Bypass Register of the Tap domains to be selected in scan path 2202 during JTAG data register scan operations. Selecting the Bypass Register in IC/cores 2204, 2206, and 2210 allows scanning don't care bits through the daisy-chained scan path 2202 from TDI 312 to TDO 314. Also, selecting the Bypass Register of IC/cores 2204, 2206, and 2210 allows the length of the data scan operation to be set to the bit length of the data register being directly accessed in IC/core 2208.

For example, if the data register being directly accessed in IC/core 2208 is 50 bits long, and the length of the daisy-chained Bypass Registers is 200 bits long, the data register scan operation can be set to 50 bits to match the length of the directly accessed data register of IC/core 2208. Alternately, if the data register being directly accessed in IC/core 2208 is 200 bits long, and the length of the daisy-chained Bypass Registers is 50 bits long, the data register scan operation can be set to 200 bits, again to match the length of the directly accessed data register of IC/core 2206. This under-scanning or over-scanning of daisy-chained Bypass registers does not effect IC/cores 2204, 2206, 2210 since, as mentioned, the data scanned into Bypass registers is don't care data.

In summarizing the differences among the embodiments of the present disclosure it is seen that:

(1) Tap domain 602 of FIG. 6 can selectively operate in daisy-chained or direct scan access modes by reversing the TCK and TMS input terminal connections to the Tap domain's Tap controller 104, and reusing auxiliary digital terminals for direct scan access TDI and TDO terminals. Tap domain 602 requires a JTAG controller (like shown in FIG. 7B) that can reverse its TCK and TMS output terminals and reuse auxiliary digital terminals for direct scan access TDI and TDO terminals.

(2) Tap domain 1502 of FIG. 15 can selectively operate in daisy-chained or direct scan access modes by reversing the TCK and TMS input terminal connections to the Tap domain's Tap controller 104, and reusing auxiliary analog terminals for direct scan access TDI and TDO terminals. Tap domain 1502 requires a JTAG controller (like shown in FIG. 16B) that can reverse its TCK and TMS output terminals and reuse auxiliary analog terminals for direct scan access TDI and TDO terminals.

(3) Tap domain 1702 of FIG. 17 can selectively operate in a daisy-chained mode using a first Tap controller 104 and in a direct scan access mode using a second Tap controller 1714. Like Tap domains 602 and 1502, Tap domain 1702 reuses auxiliary digital or analog terminals for direct scan access TDI and TDO terminals. Tap domain 1702 requires a JTAG controller (like shown in FIGS. 7B and 16B) that can reverse its TCK and TMS output terminals and reuse auxiliary digital or analog terminals for direct scan access TDI and TDO terminals.

(4) Tap domain 1902 of FIG. 19 can selectively operate in daisy-chained or direct scan access modes by using two separate TMS input terminals, and reusing auxiliary digital or analog terminals for direct scan access TDI and TDO terminals. Tap domain 1902 requires a JTAG controller (like shown in FIG. 20B) that has two separately controllable TMS output terminals and can reuse auxiliary digital or analog terminals for direct scan access TDI and TDO terminals.

(5) Tap domain 2102 of FIG. 21 can selectively operate in a daisy-chained or in a simultaneous daisy-chain and direct scan access modes. During the simultaneous daisy-chain and direct scan access mode, the daisy-chain access is achieved using the normal TDI and TDO terminals, while the direct scan access is achieved by reusing auxiliary digital or analog terminals as additional TDI and TDO terminals. Tap domain 2102 requires a JTAG controller (like shown in FIG. 22B) that has a first TDO source for transmitting data to a first TDO terminal, a second TDO source for transmitting data to an auxiliary digital or analog terminal used as a second TDO terminal, a first TDI destination for receiving data from a first TDI terminal, and a second TDI destination for receiving data from an auxiliary digital or analog terminal used as a second TDI terminal.

It should be noted that while the scan path examples of FIGS. 7A, 8, 9A-9D, 16A, 20A, 22A, and 23A-23B show all the IC/cores in the scan paths as being adapted to include one of the Tap domain embodiments of the present disclosure, that need not be the case. Indeed the scan paths may include mixtures of IC/cores with adapted and non-adapted Tap domains. For example, in scan path 702 of FIG. 7A, IC/cores 704 and 710 may include the non-adapted Tap domains 402 of FIG. 4 while IC/cores 706 and 708 include the adapted Tap domains 602 of FIG. 6. Similarly, the other scan paths could contain mixtures of adapted Tap domains and non-adapted Tap domains. The operation of the present embodiments to provide direct scan access to a selected and adapted Tap domain in a scan path of Tap domains is independent of whether the scan path includes non-adapted Tap domains or not.

Although the present embodiments have been described in detail, it should be understood that various changes, substitutions, and alterations may be made without departing from the spirit of the disclosure.

What is claimed is:

1. An integrated circuit comprising:
   (a) core circuitry;
   (b) tap domain circuitry coupled to the core circuitry, the tap domain circuitry including a test data input, a test data output, a test clock input, a test mode select input, and control outputs;
   (c) auxiliary circuitry separate from the tap domain circuitry, the auxiliary circuitry having auxiliary inputs, auxiliary outputs, a control input coupled to the control outputs, and output buffer control outputs; and
   (d) output buffers, each output buffer having an input coupled to an auxiliary output, a control input coupled to an output buffer control output, and an output;
   (e) the tap domain circuitry including:
      controller circuitry having a clock input coupled to the test clock input, a mode select input coupled to the test mode select input, and the control outputs;
      instruction register circuitry having a data input coupled to the test data input, an instruction data output, an instruction control output, and a control input coupled to the control outputs;

data register circuitry having a data input coupled to the test data input, a data register data output, an instruction control input coupled to the instruction control output, and a control input coupled to the control outputs;

multiplexer circuitry having an instruction data input coupled to the instruction data output, a data register data input coupled to the data register data output, a control input coupled to the control outputs, and a multiplexer output; and test data out register having an input coupled to the multiplexer output, a control input coupled to the control outputs, and a data output coupled to the test data output.

2. The integrated circuit of claim 1 in which the auxiliary circuitry includes a serial data input coupled to the test data input and a serial data output coupled to the test data output.

3. An integrated circuit comprising:
(a) core circuitry;
(b) tap domain circuitry coupled to the core circuitry, the tap domain circuitry including a test data input, a test data output, a test clock input, a test mode select input, and control outputs;
(c) auxiliary circuitry separate from the tap domain circuitry, the auxiliary circuitry having auxiliary inputs, auxiliary outputs, a control input coupled to the control outputs, and output buffer control outputs; and
(d) output buffers, each output buffer having an input coupled to an auxiliary output, a control input coupled to an output buffer control output, and an output;
(e) in which the auxiliary circuitry includes digital circuitry.

4. An integrated circuit comprising:
(a) core circuitry;
(b) tap domain circuitry coupled to the core circuitry, the tap domain circuitry including a test data input, a test data output, a test clock input, a test mode select input, and control outputs;
(c) auxiliary circuitry separate from the tap domain circuitry, the auxiliary circuitry having auxiliary inputs, auxiliary outputs, a control input coupled to the control outputs, and output buffer control outputs; and
(d) output buffers, each output buffer having an input coupled to an auxiliary output, a control input coupled to an output buffer control output, and an output;
(e) including input buffers, each input buffer having an input coupled to the output of an output buffer and an output coupled to an auxiliary input.

* * * * *